United States Patent
Uchiyama et al.

(10) Patent No.: US 6,635,523 B1
(45) Date of Patent: Oct. 21, 2003

(54) SEMICONDUCTOR DEVICE AND METHOD OF MANUFACTURING THE SAME

(75) Inventors: Yuji Uchiyama, Kanagawa (JP); Toshiya Suzuki, Kanagawa (JP); Atsuhiro Tsukune, Kanagawa (JP); Takae Sukegawa, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/204,277

(22) Filed: Dec. 3, 1998

(30) Foreign Application Priority Data

Dec. 4, 1997 (JP) .............................. 9-333985

(51) Int. Cl.[7] ......................................... H01L 21/8242
(52) U.S. Cl. ....................... 438/239; 438/240; 438/250; 438/396
(58) Field of Search ................ 438/239, 240, 438/250, 253, 393, 396

(56) References Cited

U.S. PATENT DOCUMENTS

| | | | | |
|---|---|---|---|---|
| 5,279,985 A | * | 1/1994 | Kamiyama ..................... 437/60 |
| 5,392,189 A | * | 2/1995 | Fazan et al. ................. 257/306 |
| 5,622,888 A | * | 4/1997 | Sekine et al. ................ 438/398 |
| 5,654,581 A | * | 8/1997 | Radosevich et al. ......... 257/534 |
| 5,668,041 A | * | 9/1997 | Okudaira et al. ............ 438/240 |
| 5,861,332 A | * | 1/1999 | Yu et al. ..................... 438/240 |
| 6,020,248 A | * | 2/2000 | Zenke ......................... 438/398 |
| 6,043,529 A | * | 3/2000 | Hartner et al. .............. 257/306 |
| 6,096,597 A | * | 8/2000 | Tsu et al. .................... 438/240 |

FOREIGN PATENT DOCUMENTS

| | | |
|---|---|---|
| JP | 2-226754 | 9/1990 |
| JP | 3-136361 | 6/1991 |
| JP | 6-275776 | 9/1994 |
| JP | 8-139288 | 5/1996 |
| KR | 97-18589 | 4/1997 |

OTHER PUBLICATIONS

Korean Office Action dated Aug. 25, 2000 with translation.

* cited by examiner

Primary Examiner—Michael Trinh
(74) Attorney, Agent, or Firm—Armstrong, Westerman & Hattori, LLP

(57) ABSTRACT

The method of forming a capacitor of a semiconductor device comprises the steps of forming a semiconductor film connected to a semiconductor substrate, forming a capacitor lower electrode made of a tungsten film selectively on a surface of the semiconductor film by causing a tungsten compound gas to react with the semiconductor film, forming a tungsten nitride film by nitriding a surface of the tungsten film by using a nitrogen gas or a nitrogen containing gas, forming a capacitor dielectric film made of oxygen compound on the tungsten nitride film, annealing the capacitor dielectric film in an oxygen containing gas, and forming a capacitor upper electrode made of a conductive film on the capacitor dielectric film.

19 Claims, 20 Drawing Sheets

Without Nitriding W Film

With Nitriding W Film

10nm

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, a semiconductor device having a MIM (Metal-Insulator-Metal) type capacitor made of a high dielectric constant film and a method of manufacturing the same.

2. Description of the Prior Art

In the semiconductor memory device having a capacitor such as DRAM (Dynamic Random Access Memory), miniaturization of the capacitor is desired as the integration density of the device is increased higher. Therefore, material with a high dielectric constant, e.g., tantalum oxide ($Ta_2O_5$), etc. is recently employed as a capacitor insulating film.

The capacitor consists of a lower electrode, a dielectric film (capacitor insulating film), and an upper electrode. As the capacitor structure, a plate type structure as well as a cylinder type structure which is excellent in the integration density is employed. The plate type capacitor has been disclosed in Patent Application Publication (KOKAI) Hei 2-226754, Patent Application Publication (KOKAI) Hei 6-275776, Patent Application Publication (KOKAI) Hei 3-136361, and Patent Application Publication (KOKAI) Hei 8-139288, for example.

As disclosed in Patent Application Publication (KOKAI) Hei 2-226754 and Patent Application Publication (KOKAI) Hei 6-275776, the lower electrode of the capacitor is connected to the impurity diffusion region on the semiconductor substrate. Therefore, if the impurity diffusion region is formed shallow, the lower electrode is often formed by a silicon film which is the same material as the semiconductor substrate. In case the cylinder type capacitor is employed, tungsten (W) is not suitable for constituent material of the lower electrode if easiness in working needed to form the lower electrode into the cylindrical shape is taken into consideration. Thus, in most cases polysilicon is employed as the constituent material of the lower electrode.

Further, if a tantalum oxide film is employed as the capacitor insulating film, a method of re-oxidizing the tantalum oxide film by annealing is employed to improve the film quality of the tantalum oxide film. In this case, if the polysilicon film is used as the lower electrode, it is possible that the polysilicon film reacts with the tantalum oxide film in above annealing to thus increase a leakage current into the impurity diffusion layer. It is also possible that, since a natural oxide film with a low dielectric constant is formed on a surface of the polysilicon film, reduction in capacitance is caused.

In Patent Application Publication (KOKAI) Hei 2-226754, in order to prevent increase in the leakage current and reduction in the capacitance, a tungsten oxide ($WO_2$) film which has a high dielectric constant is employed as the capacitor insulating film which is in contact with the lower electrode. In this case, a tungsten film is employed as the upper electrode.

In Patent Application Publication (KOKAI) Hei 6-275776, in order to prevent the leakage current, a tungsten nitride (WN) film is employed as the upper electrode which is in contact with the tantalum oxide film. In this case, the polysilicon film is employed as the lower electrode and also a silicon oxide film is interposed between the polysilicon film and the tantalum oxide film.

In Patent Application Publication (KOKAI) Hei 3-136361, the tungsten film is employed as both the lower electrode and the upper electrode. In this case, in order to prevent reaction between the silicon constituting the semiconductor substrate and the tungsten film constituting the lower electrode, the tungsten nitride is interposed between the lower electrode and the semiconductor substrate.

In Patent Application Publication (KOKAI) Hei 8-139288, there are such descriptions that amorphous silicon is employed as the lower electrode, then the tungsten film and the tantalum oxide dielectric film are formed on the lower electrode, and then the upper electrode made of the titanium nitride is formed on the tantalum oxide dielectric film to thus form the capacitor. In this case, in selective growth of the tungsten film, such a step is contained that a reduction gas such as a silane ($SiH_4$) gas in addition to a tungsten halogenated gas is employed together.

However, as set forth in Patent Application Publication (KOKAI) Hei 2-226754, in case the tungsten oxide film is interposed between the polysilicon film and the tantalum oxide film, there has been a possibility that the leakage current passing through an interface between the tantalum oxide film and the polysilicon film is increased.

Also, as set forth in Patent Application Publication (KOKAI) Hei 6-275776, the silicon oxide film is interposed between the lower electrode made of polysilicon and the tantalum oxide film, which causes reduction in the capacitance as a whole capacitor.

In addition, if oxygen in the tantalum oxide film is diffused into the polysilicon of the lower electrode via the silicon oxide film, the tantalum oxide film is deteriorated, or silicon in the silicon oxide film or the polysilicon film reacts with the tantalum oxide film to thus cause the increase in the leakage current.

Also, as set forth in Patent Application Publication (KOKAI) Hei 3-136361, it is not suitable for the capacitor which has a complicated shape such as the cylinder type capacitor, to form the lower electrode and the upper electrode by the tungsten film.

Also, as set forth in Patent Application Publication (KOKAI) Hei 8-139288, in case the tungsten film, the tantalum oxide dielectric film, and the tantalum nitride film are formed on the lower electrode made of silicon to construct the capacitor, the tungsten film is silicided by annealing process if annealing process such as annealing process to improve the crystal property of the tantalum oxide dielectric film, thermal nitriding process of tantalum, or the like is applied at 500° C. or more. Then, after the tungsten film has been silicided, silicon in the tungsten film reacts with oxygen contained in the tantalum oxide dielectric film, so that silicon oxide ($SiO_2$) is formed between the tantalum oxide dielectric film and the tungsten film. As a result, since the silicon oxide has a lower dielectric constant than the tantalum oxide, the capacitance of the capacitor is reduced.

It may be thought about that, in order to prevent generation of such silicon oxide, the temperature of the annealing process is set lower than 500° C. The crystal property of the tantalum oxide dielectric film cannot be sufficiently improved to such extent that the leakage current in the capacitor can be suppressed satisfactorily.

SUMMARY OF THE INVENTION

It is an object of the present invention to provide a semiconductor device capable of preventing reaction between upper and lower electrodes and a tantalum oxide film, and also preventing diffusion of oxygen contained in a dielectric oxide film into the upper and lower electrodes, and a method of manufacturing the same.

The above object can be overcome by providing a method of manufacturing a semiconductor device comprising the steps of forming a semiconductor film connected to a semiconductor substrate; forming a capacitor lower electrode made of a tungsten film selectively on a surface of the semiconductor film by causing a tungsten compound gas to react with the semiconductor film; forming a tungsten nitride film by nitriding a surface of the tungsten film by using a nitrogen gas or a nitrogen containing gas; forming a capacitor dielectric film made of oxygen compound on the tungsten nitride film; annealing the capacitor dielectric film in a n oxygen containing gas; and forming a capacitor upper electrode made of a conductive film on the capacitor dielectric film.

Also, the above object can be overcome by providing a semiconductor device comprising impurity diffusion regions formed on a semiconductor substrate; an insulating film formed on the semiconductor substrate and having opening portions on the impurity diffusion regions; a capacitor lower electrode formed on the insulating film and made of a semiconductor film containing impurity connected to the impurity diffusion regions via the opening portions; a tungsten film of the capacitor lower electrode, formed on the semiconductor film; a tungsten nitride film of the capacitor lower electrode formed on the tungsten film; a capacitor insulating film containing oxygen, formed on the tungsten nitride film; and a capacitor upper electrode made of a conductive film being formed on the capacitor insulating film.

In the present invention, the tungsten nitride film is formed as the conductive film of the lower electrode which is contact with the capacitor dielectric film containing the oxygen.

As the method of forming the tungsten nitride film, such a method is adopted that the tungsten film is formed by causing the tungsten containing gas to react with the semiconductor and then the tungsten film is exposed to nitrogen.

When the capacitor dielectric film is processed by heating after the capacitor dielectric film containing the oxygen has been formed on the lower electrode, such tungsten nitride film can function as a barrier layer against the oxygen. For this reason, since diffusion of the oxygen from the capacitor dielectric film, e.g., tantalum oxide film to its peripheral portion can be suppressed, an amount of oxygen in the tantalum oxide film can be assured and therefore the film quality can be maintained.

Since the semiconductor film is employed as the basic portion of the lower electrode of the capacitor, the complicated structure capacitor like the cylinder type can be relatively easily formed as the capacitor.

As a result, the capacitor with the complicated structure can be formed, and also the leakage current of the capacitor can be suppressed as a whole.

The above object can be overcome by providing a method of manufacturing a semiconductor device comprising the steps of forming a semiconductor film made of silicon or silicon compound, into which impurity is doped, to be connected to a semiconductor substrate; forming a refractory metal film selectively on a surface of the semiconductor film in an atmosphere not-containing a reduction gas by introducing a refractory metal halogenated gas into the atmosphere; forming a refractory metal nitride film by nitriding a surface of the refractory metal film; forming a dielectric oxide film of group elements, group elements, or group elements on the refractory metal nitride film; and crystallizing the dielectric oxide film by virtue of heat treatment at 500° C. or more. In the method of manufacturing the above semiconductor device, an impurity concentration in the semiconductor film is set to more than $1.5 \times 10^{17}$ atoms/cm$^3$.

In the present invention, in case the refractory metal film is formed on the semiconductor film made of silicon which contains the impurity, the refractory metal halogenated gas is employed in the atmosphere which does not contain the reduction gas such as the silicon compound gas. The refractory metal film being formed by such method becomes difficult to react with constituent elements of the semiconductor film, so that the compound of the semiconductor and the refractory metal film is not generated. The impurity concentration of the semiconductor film is set to more than $1.5 \times 10^{17}$ atoms/cm$^3$.

Accordingly, since semiconductor elements are not contained in the refractory metal nitride film being obtained by nitriding the refractory metal film, the semiconductor oxide film, e.g., silicon oxide having a low dielectric constant can be prevented from being formed between the refractory metal nitride film and the dielectric oxide film even when the refractory metal nitride film is heated at 500° C. in forming the dielectric oxide film on the refractory metal nitride film or succeeding steps.

Accordingly, reduction in the dielectric constant between the upper electrode and the lower electrode can be prevented, so that reduction in the capacitance of the capacitor can be prevented.

In the structure other than the capacitor, when the refractory metal film and the refractory nitride film are formed between the silicon film and the metal film, such refractory metal film can be utilized as the barrier metal of oxygen.

DESCRIPTION OF THE PREFERRED EMBODIMENTS

Embodiments of the present invention will be explained in detail with reference to the accompanying drawings hereinafter.

(First Embodiment)

FIGS. 1A to 1G are sectional views showing steps of forming a cylinder type capacitor according to a first embodiment of the present invention.

Figure 1A:
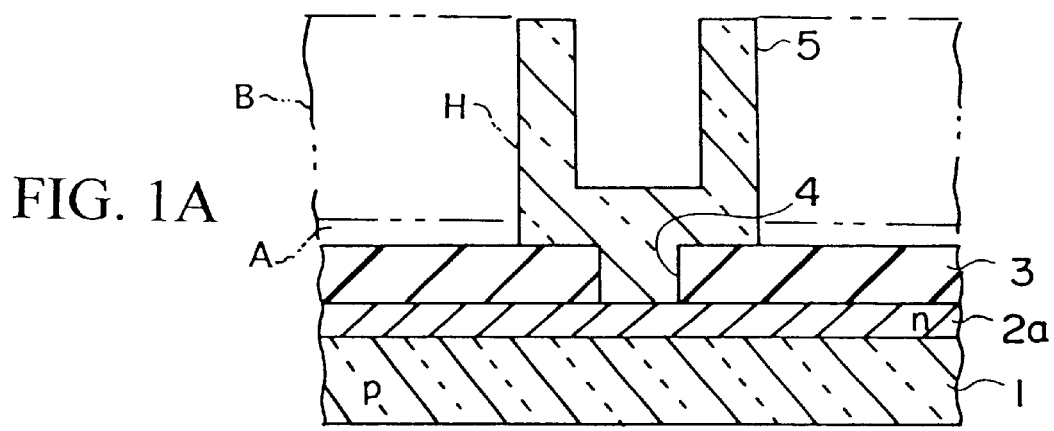
FIGS. 1A to 1G are sectional views showing steps of forming a capacitor according to a first embodiment of the present invention.

FIG. 1A shows a state wherein a polysilicon film acting as a lower electrode of the capacitor is formed and worked. As shown in FIG. 1A, a source diffusion region 2a is formed on a surface of a silicon substrate 1, and then a silicon oxide film 3 is formed on the source diffusion region 2a. A contact hole 4 is formed in the silicon oxide film 3 formed on the source diffusion region 2a. A polysilicon film 5 acting as the lower electrode is formed such that it is connected to the source diffusion region 2a via the contact hole 4. The polysilicon film 5 is doped with phosphorus which acts as n-type impurity and is formed like a cylinder.

The cylindrical polysilicon film 5 can be formed by following steps, for example.

A silicon nitride film A is formed on the silicon oxide film 3, and then a PSG (Phosphosilicate glass) film B is formed on the silicon nitride film A. Then, an opening H is formed in the PSG film B and the silicon nitride film A. Then, the polysilicon film 5 is formed on an upper surface of the PSG film B and on a bottom surface and an inner peripheral surface of the opening H. Then, the polysilicon film 5 formed on an upper surface of the PSG film B is removed by polishing, then the PSG film B is selectively removed, and then the silicon nitride film A is selectively removed. Accordingly, the polysilicon film 5 is formed to have a cylindrical shape.

Figure 1B:
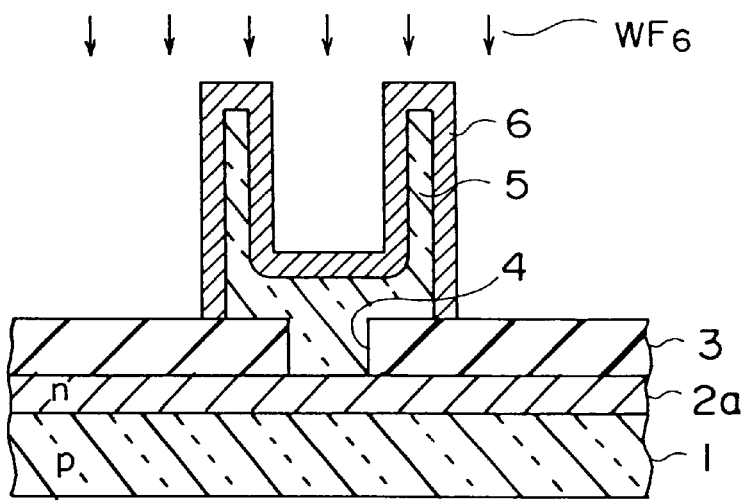

Under this condition, as shown in FIG. 1B, first the silicon substrate 1 is heated up to a temperature of 300° C., then a tungsten hexafluoride (WF$_6$) gas as a reaction gas being supplied at a flow rate of 100 sccm is added into a He (helium) gas as a carrier gas being supplied at a flow rate of 100 sccm so as to flow together such that gas pressure around the silicon substrate 1 can be kept at 500 mTorr. Then, following chemical reaction is caused on a surface of the polysilicon film 5.

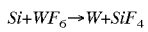

$$Si + WF_6 \rightarrow W + SiF_4$$

As a result, a tungsten (W) film 6 is selectively formed on the surface of the polysilicon film 5.

The tungsten film 6 of 10 to 20 nm thickness is formed by the CVD method by holding this condition for 120 seconds.

Figure 1C:
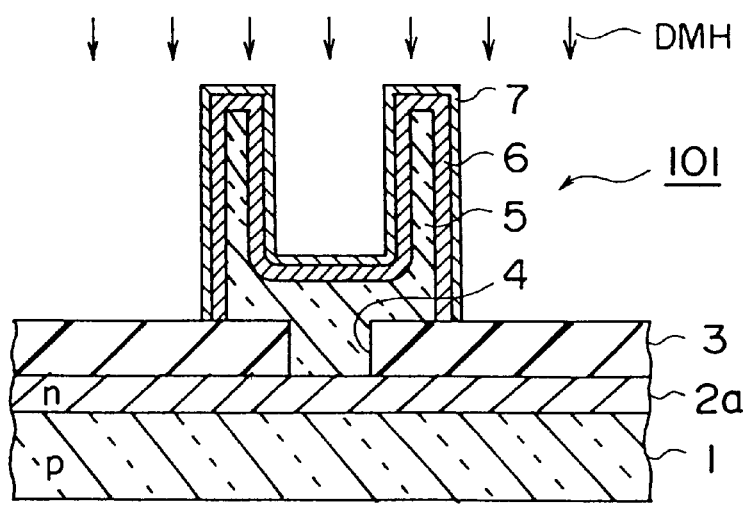

Then, a process (diluted HF process 1%, 30 second) of removing an oxide film which is formed naturally on a surface of the tungsten film 6 is effected, and then rinsing is effected. Then, as shown in FIG. 1C, the silicon substrate 1 shown in FIG. 1B is heated up to a temperature of 500° C. Then, while flowing dimethylhydrazine (DMH) at a flow rate of 100 sccm, a gas pressure around the silicon substrate 1 is held at 1 Torr. Nitriding of the surface of the tungsten film 6 is commenced to form a tungsten nitride (WN$_x$) film. The WN$_x$ film of 2 to 3 nm thickness is formed by holding this condition for 120 second. Thus, a lower electrode 101 is formed by the silicon film 5, the W film 6, and the WN$_x$ film 7.

Figure 1D:
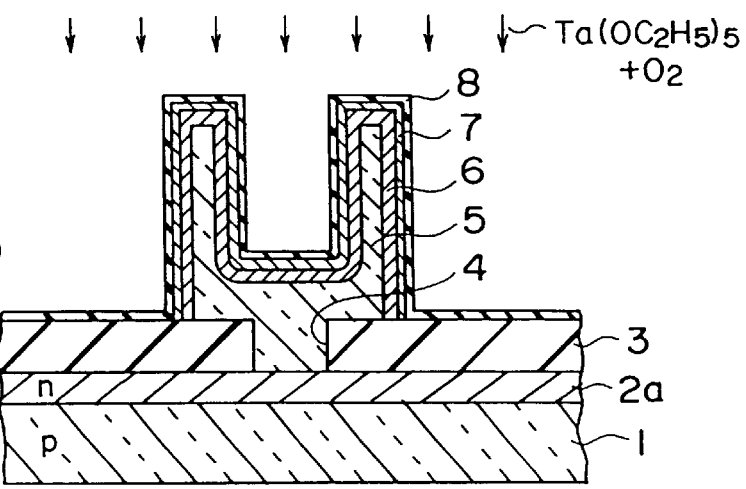

Next, as shown in FIG. 1D, the silicon substrate 1 shown in FIG. 1C is heated up to a temperature of 400° C. Then, while causing a mixed gas composed of a Ta(OC$_2$H$_5$)$_5$ gas being supplied at a flow rate of 0.1 ml/min and an O$_2$ gas being supplied at a flow rate of 1 slm to flow, a gas pressure around the silicon substrate 1 is held at 1 Torr. A Ta$_2$O$_5$ film 8 of about 8 nm thickness is formed by keeping this condition for an appropriate time by using the CVD method.

Figure 1E:
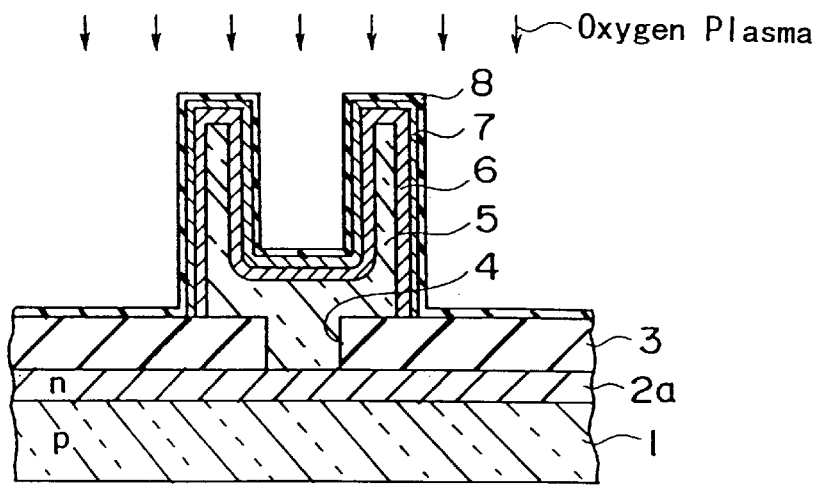
Figure 1F:
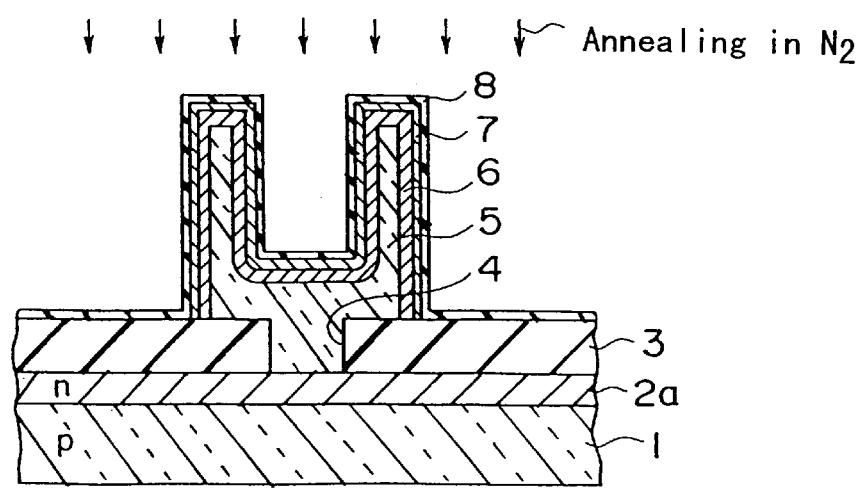

Then, as shown in FIG. 1E, the O$_2$ gas is plasmanized by holding a pressure at a 1 Torr by flowing the O$_2$ gas while annealing the silicon substrate 1 at the temperature of 400° C. Oxygen is supplied to the Ta$_2$O$_5$ film 8 by such oxygen plasma. Subsequently, as shown in FIG. 1F, the Ta$_2$O$_5$ film 8 is crystallized by annealing it in an N$_2$ gas atmosphere with keeping the substrate temperature at a temperature of 750° C. Thereby, an oxygen density in the Ta$_2$O$_5$ film 8 can be enhanced, so that film quality can be improved.

At that time, since the WNx film 7 exists below the Ta$_2$O$_5$ film 8 and thus a barrier property against the oxygen can be enhanced by the WN$_x$ film 7, diffusion of the oxygen from the Ta$_2$O$_5$ film 8 downward can be prevented. Accordingly, the film quality of the Ta$_2$O$_5$ film 8 can be held at its good condition.

Figure 1G:
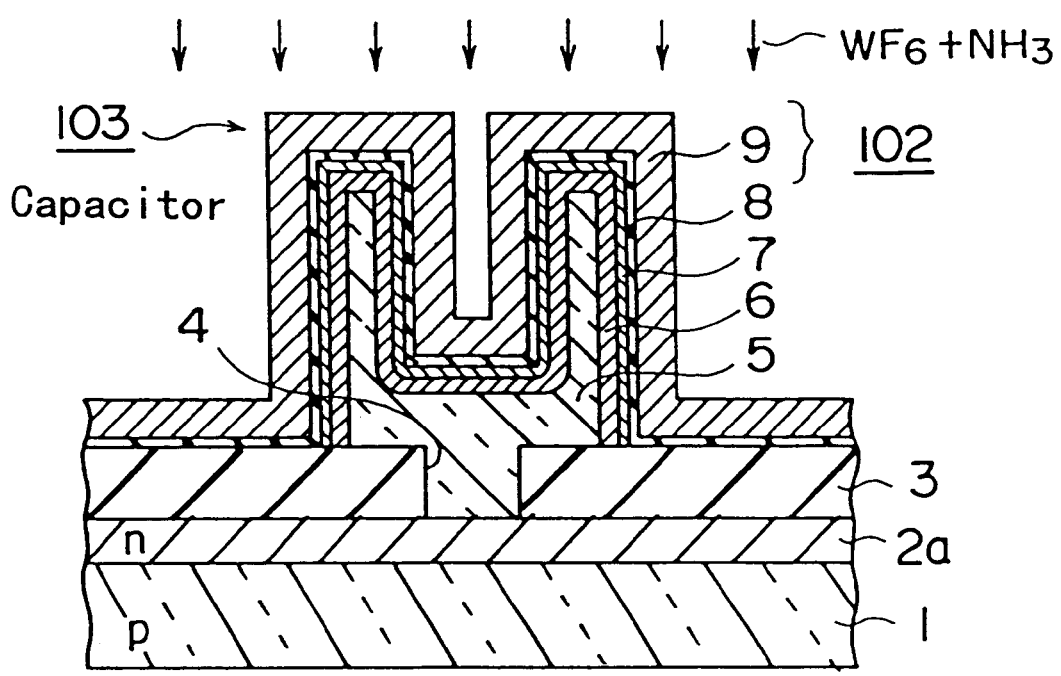

Next, as shown in FIG. 1G, the silicon substrate 1 loaded in a CVD film forming chamber is heated up to the temperature of 400° C. Then, a mixed gas consisting of the WF$_6$ gas being supplied at a flow rate of 10 sccm and an NH$_3$ gas being supplied at a flow rate of 5 sccm is flown into the CVD film forming chamber such that a gas pressure around the silicon substrate 1 can be kept at 500 mTorr. A WN$_x$ film 9 of about 50 nm thickness can be formed by holding this condition for an appropriate time.

With the above, formation of a cylinder type capacitor 103 has been completed.

According to the capacitor 103 according to the above first embodiment, since the polysilicon film 5 is employed as material of the lower electrode 101, the capacitor 103 having a complicated shape like the cylinder type capacitor can be easily formed.

The $WN_x$ films 7, 9 are formed on and below the tantalum oxide 8 to contact with the tantalum oxide film 8 respectively. Since the $WN_x$ film has a barrier property against the oxygen, diffusion of the oxygen from the tantalum oxide film 8 can be prevented. Moreover, since the film quality of the tantalum oxide film 8 can be held at its good condition, the leakage current of the capacitor 103 which flows between the lower electrode 101 and the upper electrode 102 via the tantalum oxide film 8 can be suppressed. Further, since oxidation of a surface of the tungsten film 6 can be prevented, reduction in the capacitance of the capacitor can be prevented. Then, in both cases where the surface of the tungsten film 6 is nitrided and the surface of the tungsten film 6 is not nitrided, experimental results as to change in the interface between the $Ta_2O_5$ film 8 and the tungsten film 6 will be explained hereunder.

Figure 2:
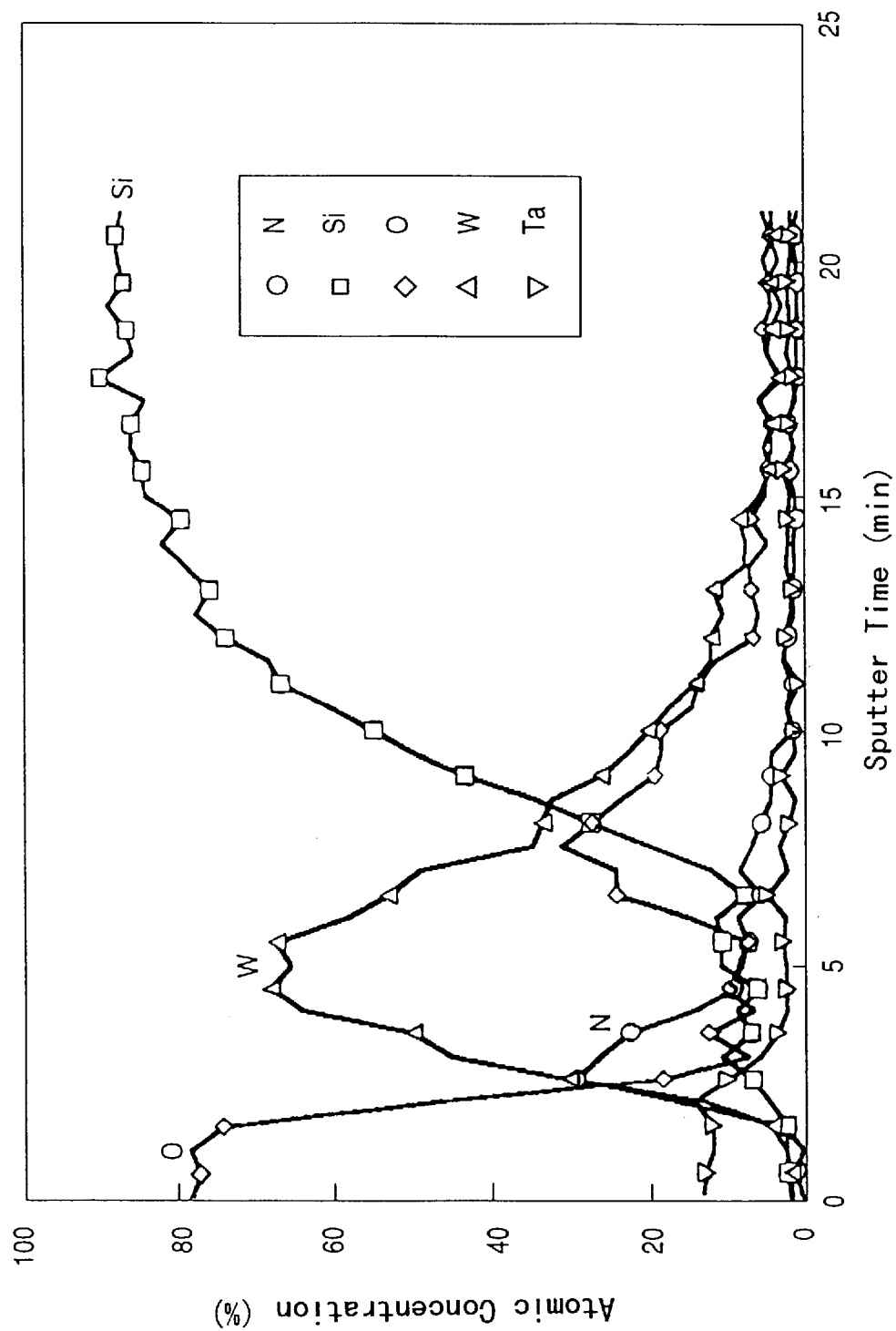
FIG. 2 is a view showing distributions of constituent elements in these films along the film thickness direction when a Ta$_2$O$_5$ film is directly formed on the tungsten film without nitriding of the surface of the tungsten film in the capacitor in the prior art.
Figure 4A:
FIGS. 4A and 4B are a sectional photograph and a sectional figure of a film constituting the capacitor in the prior art.
Figure 4B:
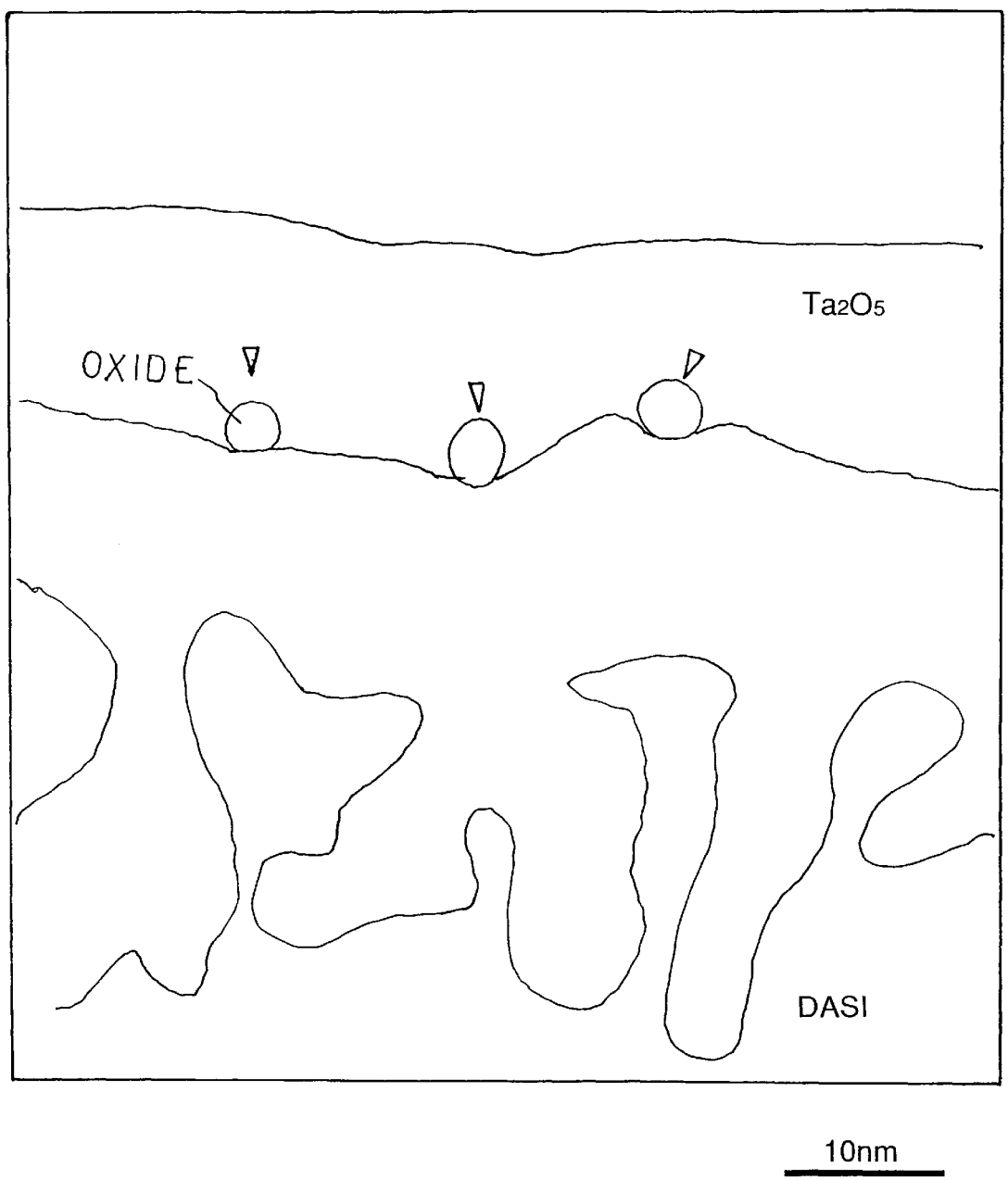

FIG. 2 shows element distributions of nitrogen, silicon, oxygen, tungsten, and tantalum contained in these films in case the $Ta_2O_5$ film 8 is directly formed on the tungsten film 6 without nitriding of the surface of the tungsten film 6 being formed on the doped amorphous silicon film 5. Sectional photograph and figure of these films are shown in FIGS. 4A and 4B.

Figure 3:
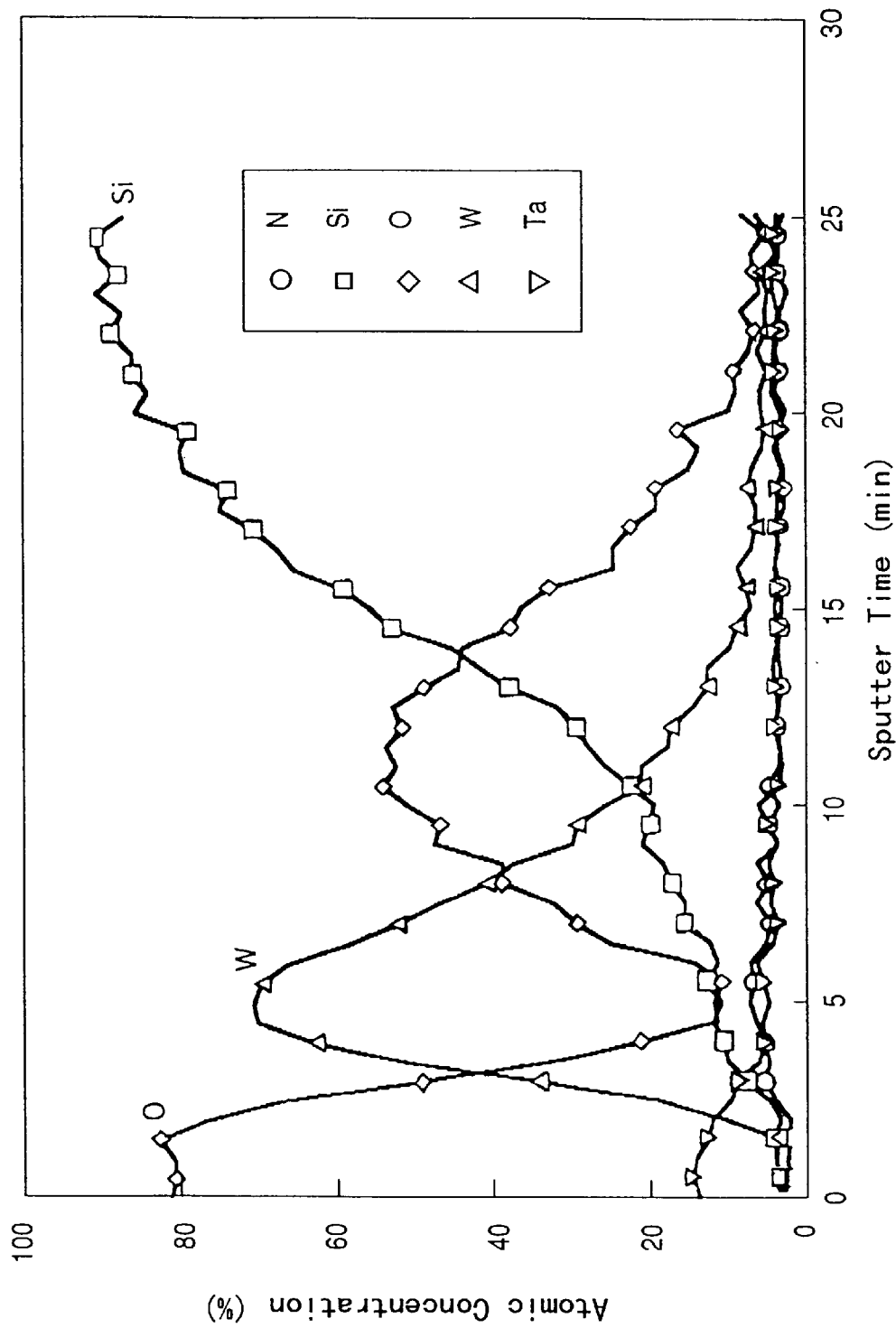
FIG. 3 is a view showing distributions of constituent elements in these films along the film thickness direction when the Ta$_2$O$_5$ film is formed on the tungsten film via the tungsten nitride film by oxidizing the surface of the tungsten film, in the capacitor according to the first embodiment of the present invention.
Figure 5A:
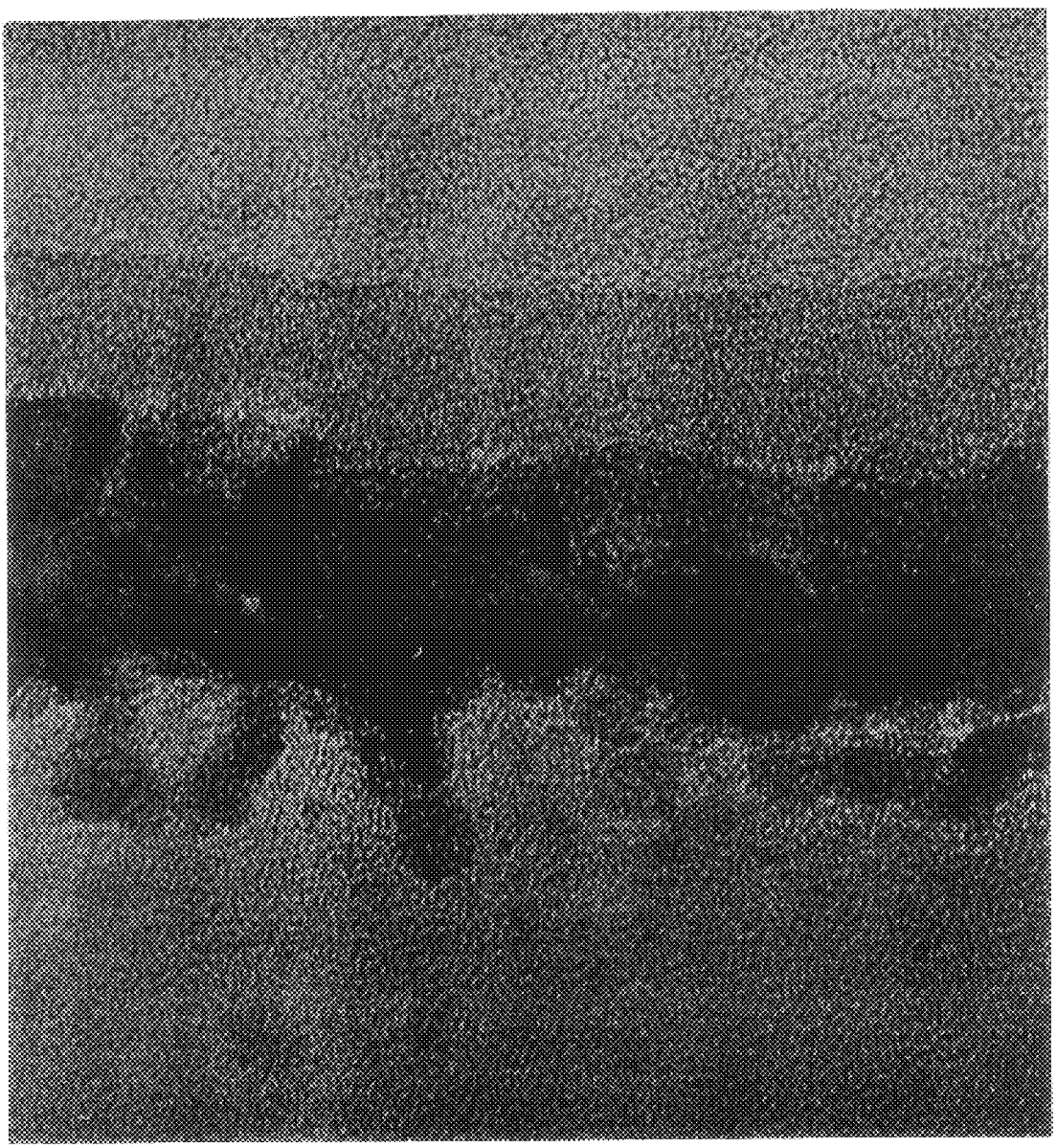
FIGS. 5A and 5B are a sectional photograph and a sectional of a film constituting the capacitor according to the first embodiment of the present invention.
Figure 5B:
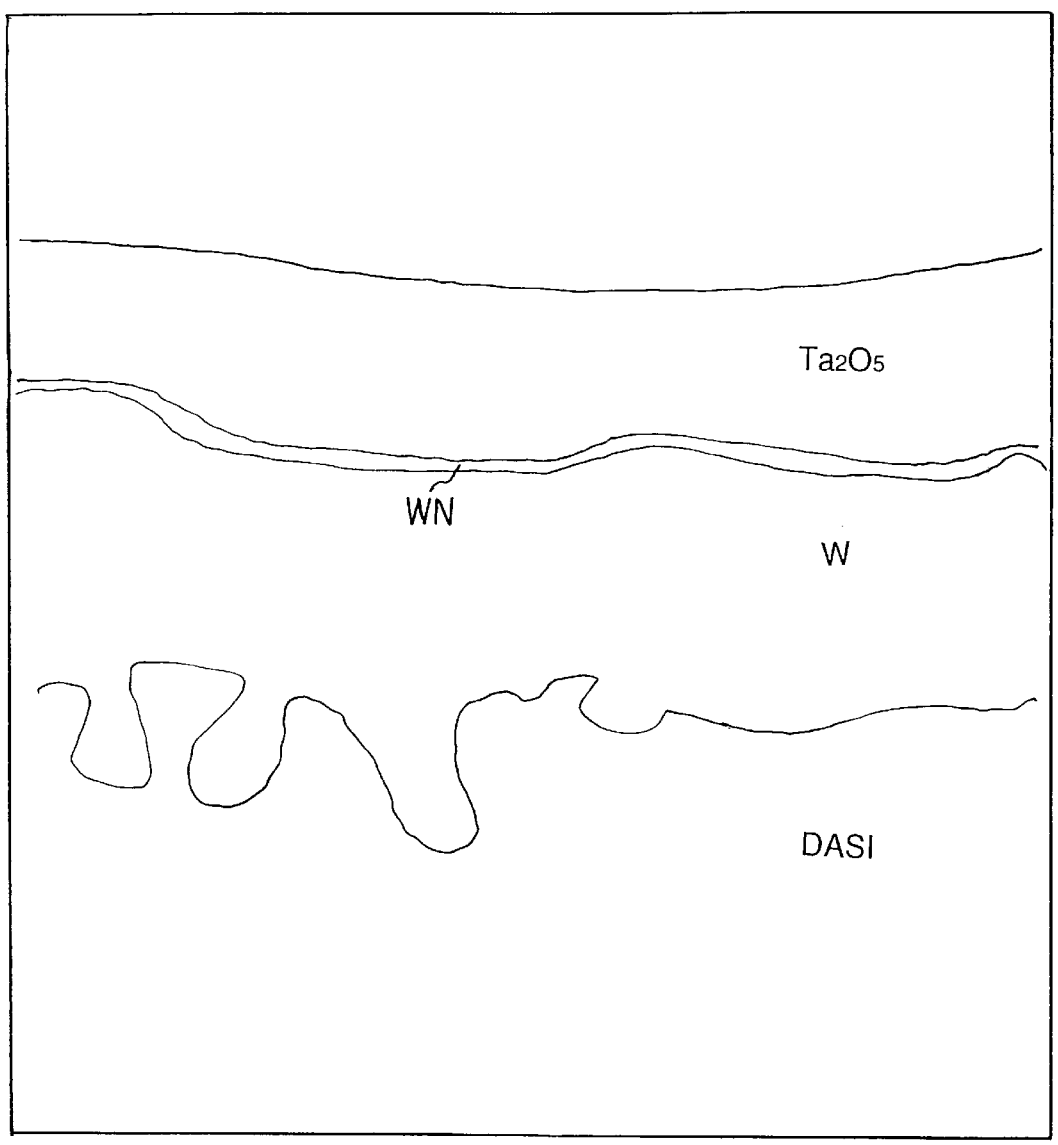

FIG. 3 also shows element distributions of nitrogen, silicon, oxygen, tungsten, and tantalum contained in such multi-layered films in case the $Ta_2O_5$ film 8 is formed on the tungsten film 6 via the $WN_x$ film 7 by nitriding the surface of the tungsten film 6 being formed on the doped amorphous silicon film 5. Sectional photograph and figure of these films are shown in FIGS. 5A and 5B.

As for the downward oxygen distribution from the surface of the $Ta_2O_5$ film 8, it becomes evident that, since the oxygen distribution in FIG. 2 is fallen down more gently than the oxygen distribution in FIG. 3, the tungsten nitride film 7 can suppress diffusion of the oxygen. The oxygen contained at a lower location than the tungsten film 6 constitutes a natural oxide on the surface of the silicon film.

As samples employed in element analysis shown in FIG. 2 and FIG. 3, samples in which the $Ta_2O_5$ film 8 is nitrided by $N_2O$ plasma, while setting the substrate temperature to 350° C., and then heated at a temperature of 750° C. for three minutes respectively have been employed. The element analysis shown in FIG. 2 and FIG. 3 are analysis results obtained by the Auger electron spectroscopy.

Figure 6:
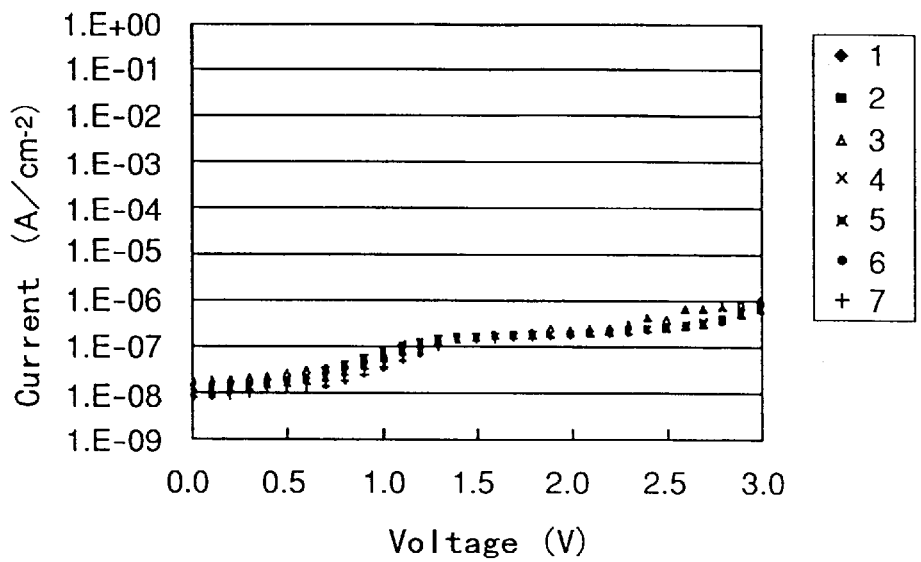
FIG. 6 is a view showing a relationship between the leakage current and the applied voltage, in the capacitor according to the first embodiment of the present invention.

Then, in both cases where the surface of the tungsten film acting as the lower electrode of the capacitor is nitrided and the surface of the tungsten film is not nitrided, the leakage currents of the capacitors have been examined respectively. FIG. 6 shows a relationship between the leakage current of the capacitor and the applied voltage when the surface of the tungsten film is nitrided. Similarly, FIG. 7 shows a relationship between the leakage current of the capacitor and the applied voltage when the surface of the tungsten film is nitrided.

Figure 7:
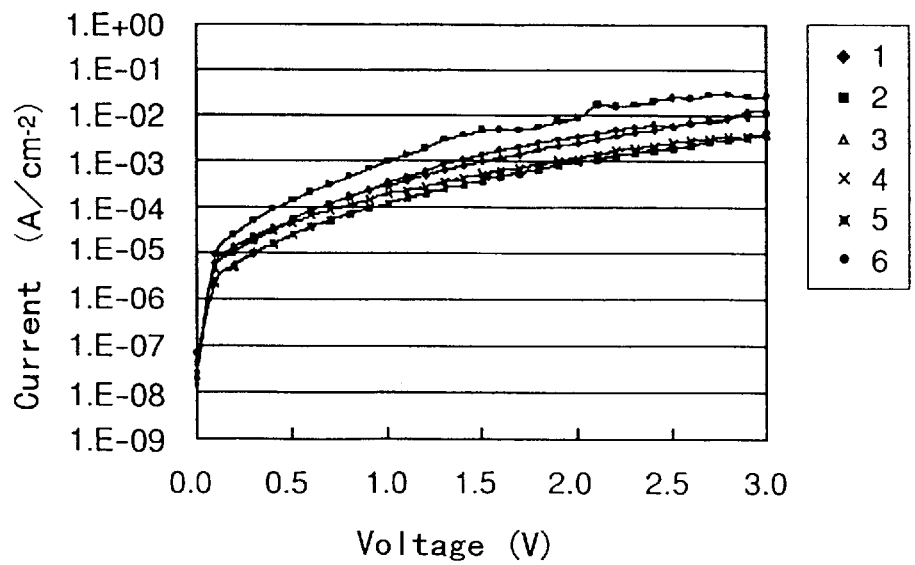
FIG. 7 is a view showing a relationship between the leakage current and the applied voltage, in the capacitor according to the prior art.

As evident from FIG. 6 and FIG. 7, it can be understood that the leakage current of the capacitor in which the tungsten nitride film is provided between the tungsten film and the $Ta_2O_5$ film is reduced smaller than that of the capacitor in which no tungsten nitride film is provided.

According to these experiments, it is made clear that the film quality of the $Ta_2O_5$ dielectric film in the capacitor according to the first embodiment can be improved and in addition the leakage current of the capacitor can be reduced.

In the first embodiment, the $WN_x$ film 9 is employed as the upper electrode 102 which is contact with the tantalum oxide film 8 and has the barrier property. However, since re-oxidation of the $Ta_2O_5$ dielectric film has already been executed prior to formation of the upper electrode, the tungsten film or titanium nitride (TiN) film or platinum (Pt), which has lower barrier property than the $WN_x$ film 9, may be employed as the upper electrode 102.

In the steps shown in FIG. 1C, dimethylhydrazine is employed in order to nitride the tungsten film. However, monomethylhydrazine, nitrogen, ammonia, etc. may be employed in place of dimethylhydrazine. Further, although the reaction gas is activated by heat in the first embodiment, such reaction gas may be activated by plasmanization.

Besides, in the above first embodiment, the $WN_x$ film 7 is grown by nitriding the surface of the tungsten film 6 after the oxide film formed on the surface of the tungsten film 6 has been removed. However, unless the silicon substrate 1 is exposed to the outer air in the steps executed from the formation of the tungsten film to the nitriding of the surface of the tungsten film, the process of removing the oxide film on the surface of the tungsten film 6 can be omitted.

In addition, the barrier metal films 7, 9 which are formed to contact with the tantalum oxide film 8 are provided to the lower electrode 101 and the upper electrode 102 respectively. But such barrier metal films are not limited to the above case, and may be applied to any one of the lower and upper electrodes.

(Second Embodiment)

Figure 8:
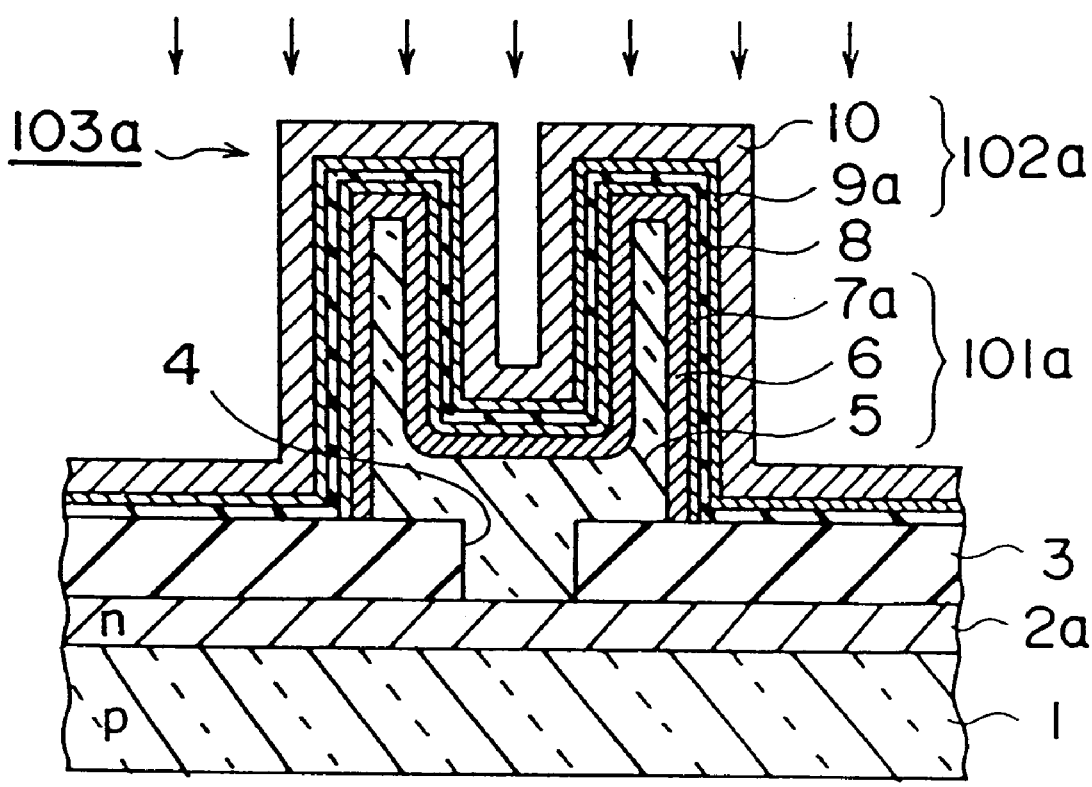
FIG. 8 is a sectional view showing steps of forming a capacitor according to a second embodiment of the present invention.

FIG. 8 is a sectional view showing steps of forming a cylinder type capacitor according to a second embodiment of the present invention.

A difference of the second embodiment from the first embodiment resides in that, in the first embodiment, the upper electrode 102 is composed of the $WN_x$ film 9 whereas, in the second embodiment, a thin $WN_x$ film 9a is formed as a barrier metal on the $Ta_2O_5$ film 8 after the processes shown in FIG. 1F have been completed, and then a metal film 10 such as tungsten, titanium nitride, titanium, etc. is formed on the $WN_x$ film 9a.

Hence, even when the upper electrode is formed as the multi-layered structure, escape of oxygen from the $Ta_2O_5$ film 8 can be prevented by assuring the oxygen barrier property with the use of the $WN_x$ film 9a.

In this case, in the second embodiment, the barrier metal film is formed on both the lower electrode 101a and the upper electrode 102a. But such barrier metal film may be formed only on the lower electrode 101a.

Further, a TiN film and a TiNO film may be formed in sequence on the surface of the polysilicon film 5 as the lower electrode 101a to then use them as the oxygen barrier film. Furthermore, two layers consisting of the TiNO film and the TiN film may be formed on the tantalum oxide film 8 as the upper electrode 102a.

(Third Embodiment)

Figure 9:
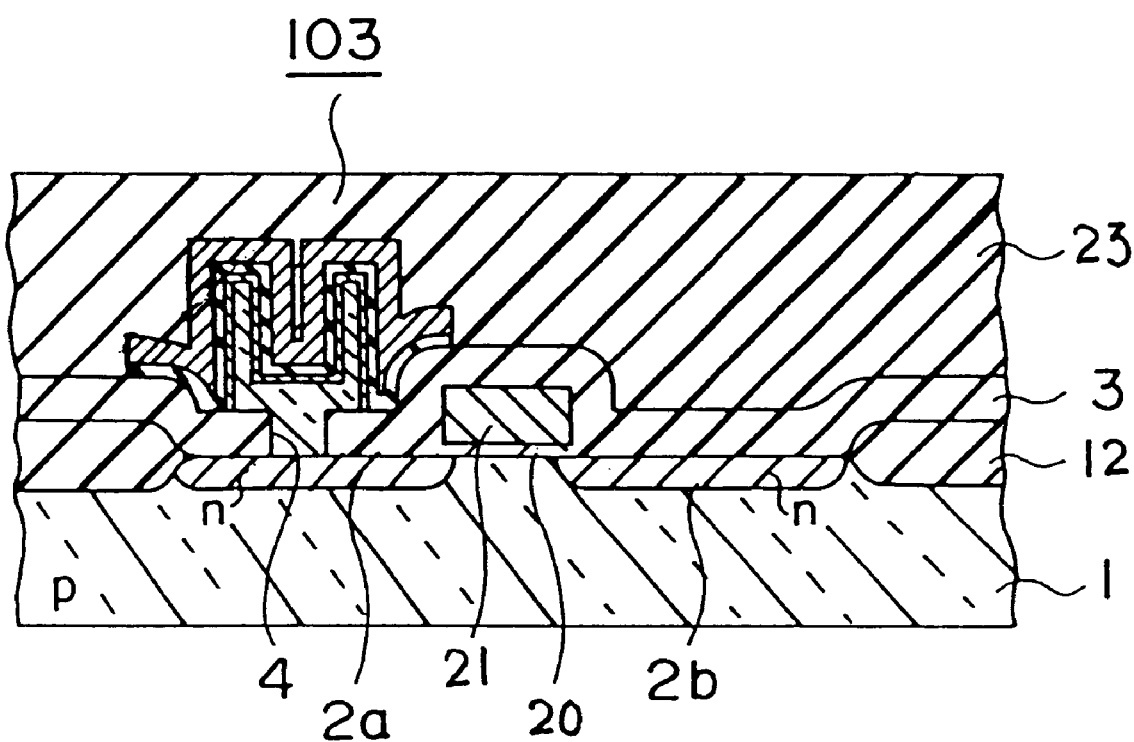
FIG. 9 is a sectional view showing a semiconductor device having a capacitor according to a third embodiment of the present invention.

FIG. 9 is a sectional view showing a capacitor portion of a DRAM according to a third embodiment of the present invention, wherein the above capacitor is applied to the DRAM.

Referring to FIG. 9, a method of forming the DRAM will be explained hereinbelow.

To begin with, a silicon oxide film 12 is formed partially on a device isolation region on the silicon substrate 1 by the LOCOS method.

A gate oxide film 20 made of a silicon oxide film is then formed by thermal oxidation. A polysilicon film is then formed, and a gate electrode 21 is then formed by patterning the polysilicon film.

A silicon oxide film 3 is then formed on an overall surface, and a contact hole 4 is then formed on the source diffusion region 2a by patterning the silicon oxide film 3.

Then, according to the method described in the first embodiment, a capacitor 103 which is connected to the source diffusion region 2a via the contact hole 4 is formed.

An insulating film 23 made of the silicon oxide film, the PSG film, or the like is then formed by the CVD method to cover the capacitor 103.

After this, a DRAM which is equipped with the capacitor of the present invention is formed via ordinary steps.

According to the DRAM which is equipped with the capacitor of the above third embodiment, since the capacitor of the first embodiment is provided, the leakage current of the capacitor 103 which flows between the lower electrode 101 and the upper electrode 102 via the tantalum oxide film 8 can be suppressed.

As a result, the DRAM of the higher density as well as power saving can be achieved, and thus storage of data can be carried out with high reliability.

Although the capacitor 103 which is connected to the n-type source diffusion region 2a has been explained in the above first and second embodiments, the present invention may be applied to the capacitor which is connected to a p-type source diffusion region. In this case, a p-type impurity is doped into the polysilicon film of the lower electrode.

In the above embodiments, the tantalum oxide has been employed as material of the capacitor dielectric film. But $TiO_2$, $Nb_2O_5$, or $ZrO_2$ may be employed as the capacitor dielectric film.

(Fourth Embodiment)

FIGS. 10A to 10F are sectional views showing steps of forming a capacitor having a MIM structure according to a fourth embodiment of the present invention.

First, as shown in FIG. 10, a field oxide film (insulating film) 12 to surround a capacitor forming region is formed on a surface of an n-type silicon substrate 11. This field oxide film 12 can be formed by the selective oxidation method by using a silicon nitride as a mask, for example.

As shown in FIG. 9, an impurity diffusion layer 2a into which phosphorus or arsenic is doped may be formed previously on the silicon substrate 11 below the capacitor forming region.

Figure 10A:
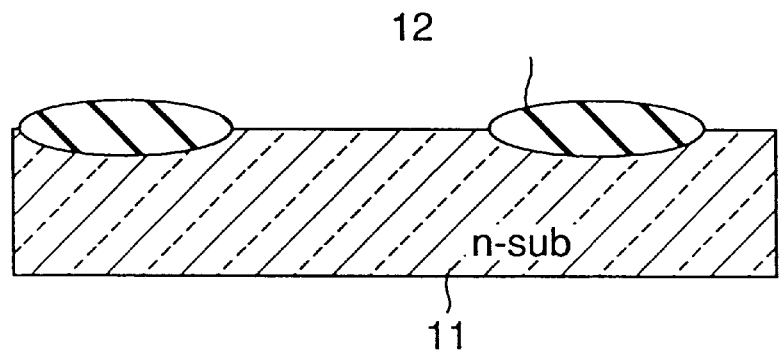
FIGS. 10A to 10F are sectional views showing steps of forming a capacitor according to a fourth embodiment of the present invention.
Figure 10B:
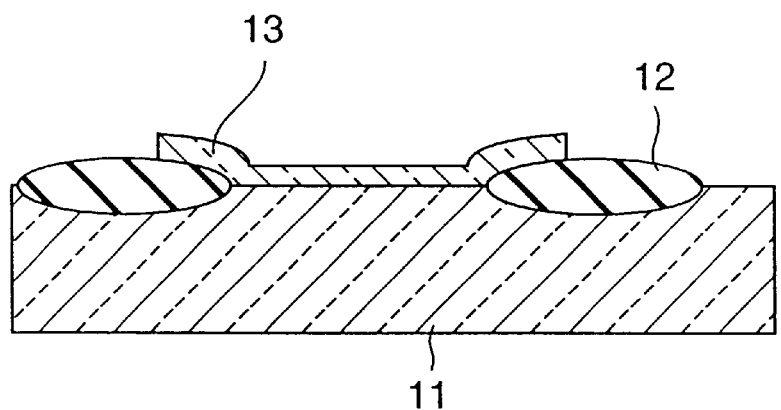

In turn, as shown in FIG. 10B, an amorphous silicon film 13, into which phosphorus or arsenic is doped as impurity, is formed by the chemical vapor deposition (CVD) method to have a thickness of 50 nm. An impurity concentration is set in the range of $1.5 \times 10^{17}$ atoms/cm$^3$ to $1 \times 10^{22}$ atoms/cm$^3$, e.g., $1.4 \times 10^{21}$ atoms/cm$^3$.

The amorphous silicon film 13 is grown by using a silane ($SiH_4$) gas. Arsine ($AsH_3$) or phosphine ($PH_3$) acting as an n-type impurity source gas is mixed into the silane gas.

The amorphous silicon film 13 is shown in FIG. 10B in the state where it is left only on the capacitor forming region and the field oxide film 2 around the capacitor forming region by patterning the amorphous silicon film by virtue of the photolithography method.

Figure 10C:
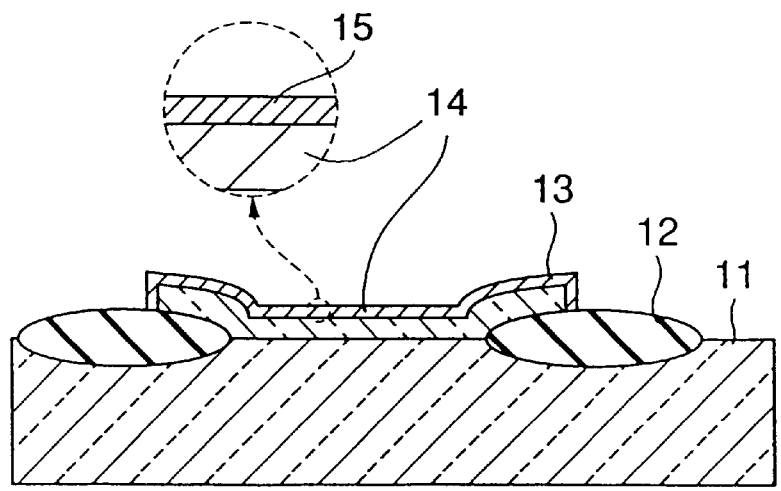

As shown in FIG. 10C, by using the reduction reaction of the underlying silicon, a tungsten film 14 of less than 70 nm (e.g., 10 nm) thickness is selectively grown on an exposed surface of the amorphous silicon film 13. The tungsten film 14 is grown by the CVD method using the tungsten hexafluoride ($WF_6$) gas. Only $WF_6$ as the growth gas and argon (Ar) as the carrier gas are introduced into the atmosphere in which the tungsten film 14 is grown, but no silane gas as the reduction gas is introduced into such atmosphere.

Then, a surface of the tungsten film 14 is exposed to a nitrogen atmosphere and then the temperature of the silicon substrate 11 is set to 500° C. to 850° C. Thus, a surface of the tungsten film 14 is nitrided to grow a tungsten nitride (WN) film 15. In this case, a pressure of the nitrogen atmosphere is set to about 10 Torr. This nitriding process is conducted to prevent oxidation of the surface of the tungsten film 14. As the gas introduced into the nitrogen atmosphere, there are nitrogen, ammonia, and methylhydrazine, for example.

Figure 10D:
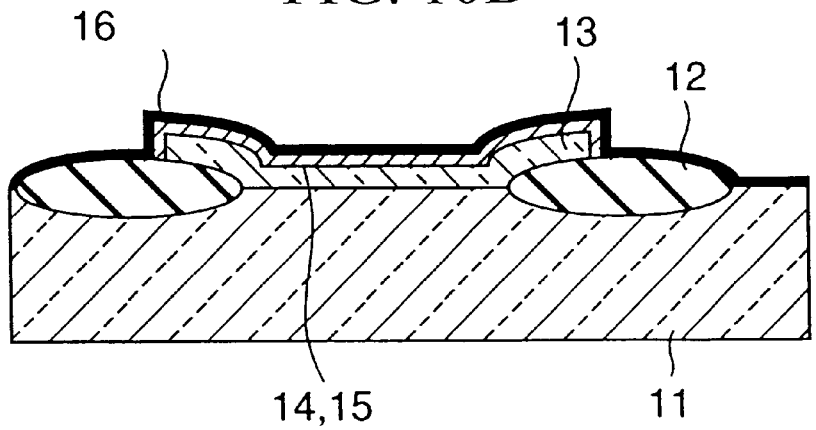
Figure 10E:
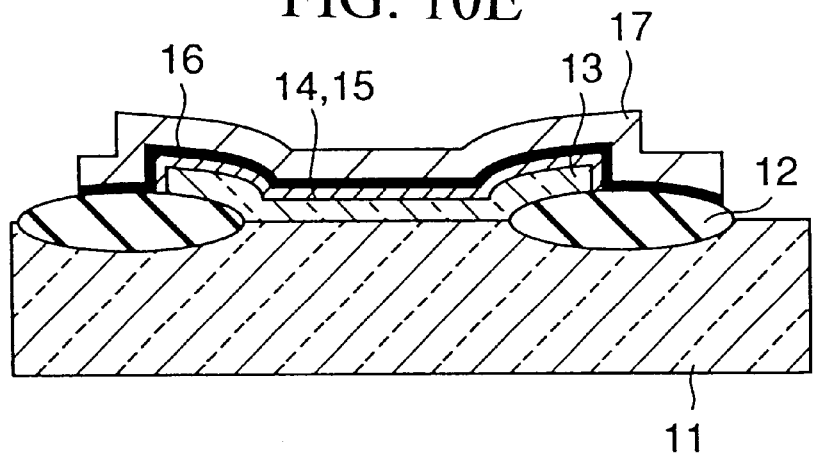

Next, as shown in FIG. 10D, by using pentaethoxytantalum ($Ta(OC_2H_5)_5$) as the growth gas, a tantalum oxide ($Ta_2O_5$) film 16 is grown on the tungsten nitride film 15 and the field oxide film 12. Then, crystal property of the $Ta_2O_5$ film 16 is improved according to the rapid thermal annealing. In this case, the temperature and the processing time of the rapid thermal annealing are set within the range of 500° C. to 900° C. (e.g., 750° C.) and 180 seconds respectively. At this time, no reaction to silicide the tungsten film 14 occurs.

In turn, oxygen deficiency is compensated by exposing the $Ta_2O_5$ film 16 to the oxidation atmosphere of oxygen plasma or oxygen containing gas plasma. In the oxygen supply process of the $Ta_2O_5$ film 16, for example, the oxygen gas is introduced into the oxidation atmosphere at a flow rate of 200 sccm, the substrate temperature is set within the range of 300° C. to 500° C. (e.g., 350° C.), a high frequency power applied to a plasma region is set to 300 W, and the time to expose the $Ta_2O_5$ film 16 to the oxygen atmosphere is set to about three minutes.

In this case, the rapid thermal annealing of the $Ta_2O_5$ film 16 and the oxygen compensation process of the $Ta_2O_5$ film 16 may be executed in a reverse sequence.

A titanium nitride (TiN) film 17 is then formed on the $Ta_2O_5$ film 16 by the CVD method to have a thickness of 50 nm. Then, the titanium nitride film 17 and the $Ta_2O_5$ film 16 are patterned by the photolithography method to be left in the range covering the lower electrodes 14, 15. A reaction gas in etching to pattern the titanium nitride film 17 is a chlorine gas or a chlorine compound gas, for example.

After the titanium nitride film 17 has been patterned, the step of patterning the $Ta_2O_5$ film 16 may be omitted.

As a result, a basic structure of the MIM type capacitor which has the tungsten film 14 and the tungsten nitride film 15 as the lower electrode, the $Ta_2O_5$ film 16 as the dielectric film, and the titanium nitride film 17 as the upper electrode can be completed. In the above plural steps, major parameters and conditions are given in Table 1.

TABLE 1

| Step order | Process | Parameter | Condition of the present invention |
|---|---|---|---|
| 1 | DASI film formation | Doped amount | More than 1.5E17 |
| 2 | Selective W film formation | Film forming gas | Only the carrier gas and $WF_6$ |
| 3 | Nitriding | Temperature | More than 500° C. |
| 4 | $Ta_2O_5$ | — | |
| 5(6) | RTA | Temperature | More than 500° C. |
| 6(5) | $O_2$ plasma | — | |

Figure 10F:
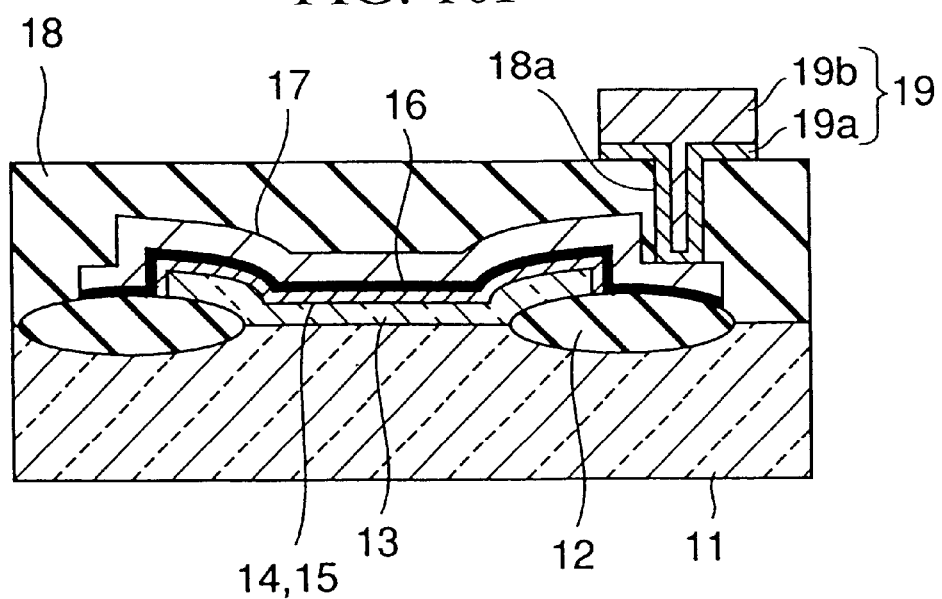

Subsequently, an interlayer insulating film 18 made of silicon oxide is formed by the plasma CVD method using the vaporized TEOS (Tetraethoxysilane) as the reaction gas so as to cover the titanium nitride film 17. As shown in FIG. 10F, an opening portion 18a which exposes a part of the titanium nitride film 17 is then formed by patterning the interlayer insulating film 18 with the use of photolithography.

A wiring 19 is then formed on the interlayer insulating film 18. A part of the wiring 19 is then connected to the titanium nitride film 17 via the opening portion 18a. The wiring 19 consists of a first two-layered structure film 19a which is formed by stacking titanium and titanium nitride in sequence, and a second two-layered structure film 19b which consists of an aluminum film and a copper alloy film being formed on the first two-layered structure film 19a.

According to the above steps, the steps of forming the capacitor on the silicon substrate 11 have been completed.

In place of the tungsten film 14, a refractory metal film such as tantalum, titanium, molybdenum, cobalt may be employed. As a source gas employed in forming these refractory metal films, a refractory metal halogenated gas, for example, $TaCl_5$, $TiCl_4$, $MoF_5$, $CoF_2$, etc. may be employed. But a silicon compound gas is not employed in forming the refractory metal. The carrier gas into which the refractory metal halogenated gas is introduced is not limited to argon. An inert gas such as helium, nitrogen, etc. may be employed as the carrier gas.

The silicon film 13 formed below the refractory metal film is not limited to the above amorphous silicon, and either polysilicon or single crystal may be employed. In addition, a silicon group semiconductor film such as carbon containing silicon may be employed instead of the silicon film 13.

Moreover, the dielectric film is not limited to $Ta_2O_5$. Group 4A element oxides (e.g., $TiO_2$) and group 5A element oxides (e.g., $NbO_5$) may be employed.

Meanwhile, as described above, it has been found that, when the tungsten film 14 is formed under the conditions that the impurity concentration of the amorphous silicon film 13 is set to exceed $1.5 \times 10^{17}$ atoms/cm$^3$ and silane is not added to the growth gas, the tungsten film 14 does not react with the silicon film 13 formed below the tungsten film 14 in the annealing process executed in the succeeding steps, i.e., annealing process to nitride the surface of the tungsten film 14 or annealing process to oxidize the $Ta_2O_5$ film 16, whereby the tungsten film 14 is not silicided.

Figure 11:
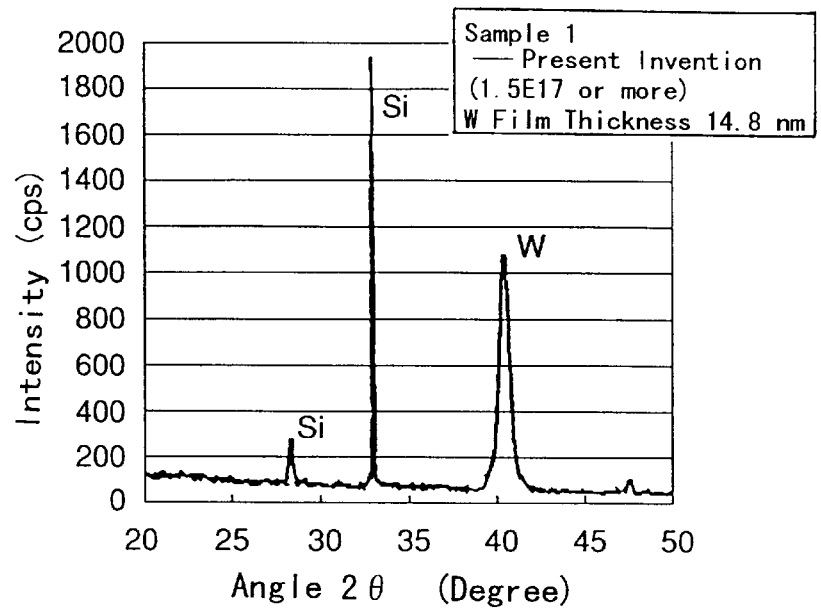
FIG. 11 is a view showing an XRD spectrum of a silicon film of a high impurity concentration and a tungsten film formed on the silicon film after annealing, in the steps of forming the capacitor according to the fourth embodiment of the present invention.

For instance, a sample 1 is formed by forming the amorphous silicon film which has an arsenic or phosphorus concentration of $1.4 \times 10^{21}$ atoms/cm$^3$, then forming the tungsten film on the amorphous silicon film, and then annealing the tungsten film and the amorphous silicon film for thirty minutes by setting the substrate temperature to 750° C. in the low pressure atmosphere. When this sample 1 is measured by using the XRD (X-ray diffraction) spectrum measurement, as shown in FIG. 11, there exists no peak at an angle 2 θ indicating tungsten silicide (WSi).

Figure 12:
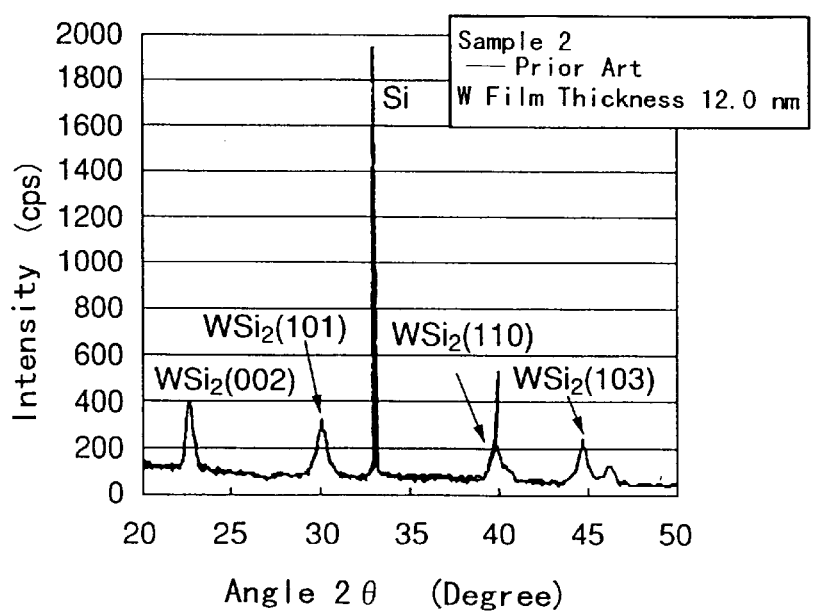
FIG. 12 is a view showing an XRD spectrum of a silicon film of a low impurity concentration and a tungsten film formed on the silicon film after annealing, in the steps of forming the capacitor in the prior art.

On the contrary, like the prior art, a sample 2 is formed by forming the tungsten film on the amorphous silicon film which has an arsenic or phosphorus impurity concentration of less than $1.5 \times 10^{17}$ atoms/cm$^3$, and then annealing the tungsten film and the amorphous silicon film for thirty minutes at 750° C. in the low pressure atmosphere. When this sample 2 is measured by using the XRD spectrum measurement, as shown in FIG. 12, there exists a peak at an angle 2 θ indicating the tungsten silicide. As a result, the presence of the tungsten silicide which has face orientations of (002) face, (101) face, and (103) face has been confirmed.

In this case, the tungsten films of the samples 1, 2 which are formed by using the $WF_6$ gas and the argon gas are employed.

Figure 13:
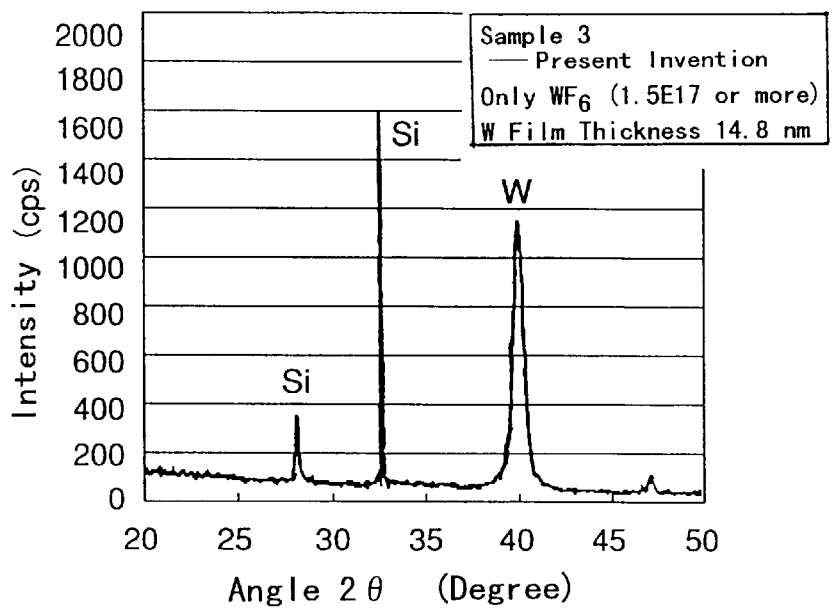
FIG. 13 is a view showing an XRD spectrum of a tungsten film grown without silane and a silicon film formed below the tungsten film after annealing, in the steps of forming the capacitor according to the fourth embodiment of the present invention.

Next, in the fourth embodiment, under the condition that only the $WF_6$ gas and the carrier gas are introduced into the reaction chamber without silane, the tungsten film is formed on the amorphous silicon film by the CVD method, and then the tungsten film and the amorphous silicon film are heated for 30 minutes at 750° C. in the low pressure atmosphere. When a resultant sample 3 is measured by the XRD spectrum measurement, as shown in FIG. 13, there appears no peak at an angle 2 θ indicating the tungsten silicide.

Figure 14:
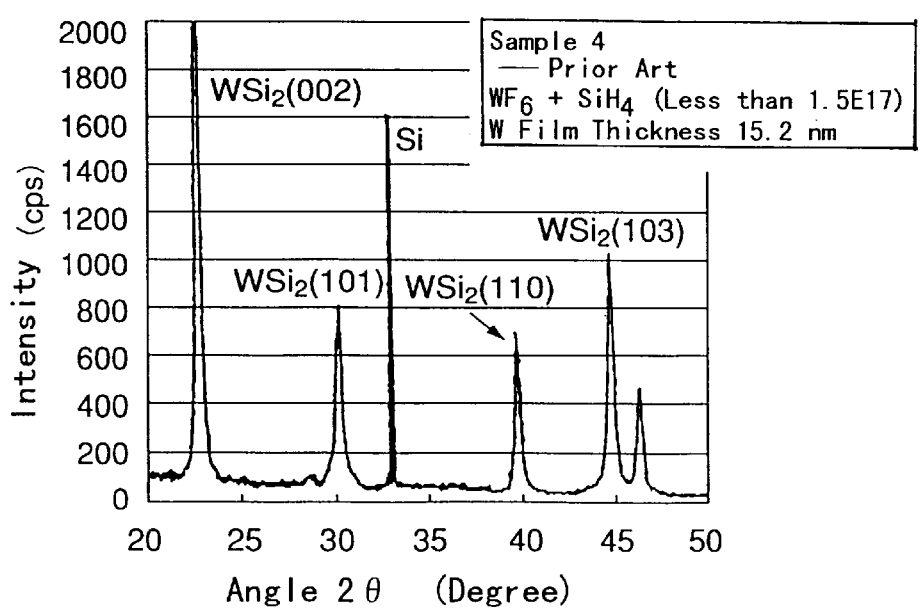
FIG. 14 is a view showing an XRD spectrum of a tungsten film formed by using silane and a silicon film formed below the tungsten film after annealing, in the steps of forming the capacitor in the prior art.

Then, like the prior art, under the condition that the $SiH_4$ gas, the $WF_6$ gas, and the argon gas are introduced into the reaction chamber without silane, the tungsten film is formed on the amorphous silicon film by the CVD method, and then the tungsten film and the amorphous silicon film are heated for 30 minutes at 750° C. in the low pressure atmosphere. When a resultant sample 4 is measured by the XRD spectrum measurement, as shown in FIG. 14, there appears a peak at an angle 2 θ indicating the tungsten silicide. As a result, the presence of the tungsten silicide (WSi) which has face orientations of (101) face, (110) face, and (103) face has been confirmed.

In this case, the impurity concentration of the amorphous silicon films in the samples 3, 4 is set to $1.4 \times 10^{21}$ atoms/cm$^3$.

Although the tungsten film has been formed on the amorphous silicon film in the samples 1 to 4, the same effect can be achieved if the refractory metal film such as tantalum, titanium, molybdenum, cobalt may be employed in place of the tungsten film.

The above capacitor and the method of forming the same may be employed in the volatile semiconductor device such as the DRAM. As in the fourth embodiment, the refractory metal film, which is formed on the silicon film of the impurity concentration of more than $1.5 \times 10^{17}$ atoms/cm$^3$ by the CVD method without introduction of the reduction gas, may be utilized as the barrier metal between another metal film formed thereon and the silicon film.

The appearance of the tungsten silicide on the silicon film is influenced from the differences of the heating temperature of the tungsten film and the doped impurity concentration in the silicon film, as follows.

Figure 15:
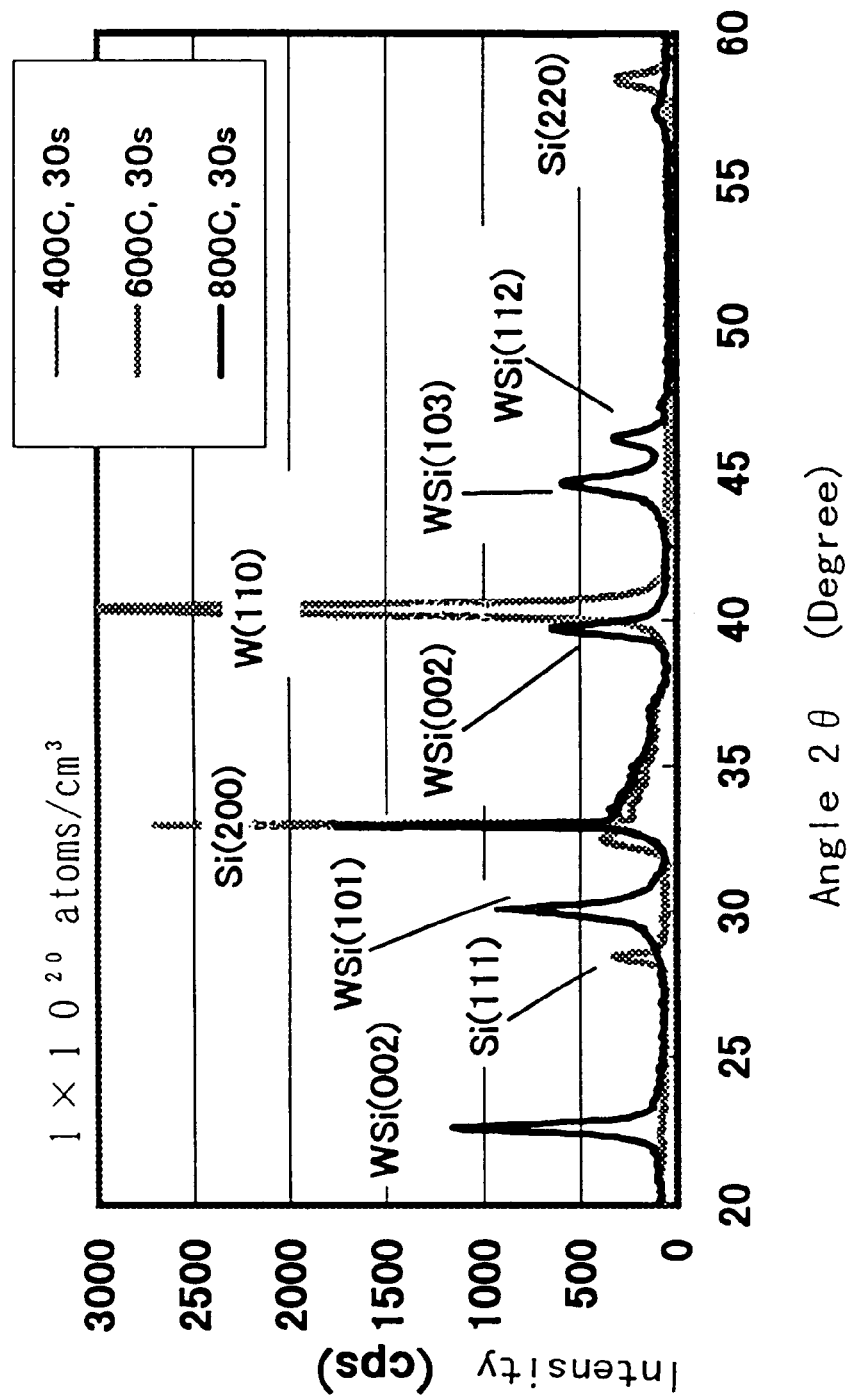
FIG. 15 is a view showing an XRD spectrum of a silicon film having a high impurity concentration $1 \times 10^{20}$ atoms/cm$^3$ and a tungsten film formed on the silicon film after annealing, in the steps of forming the capacitor according to the fourth embodiment of the present invention.

The tungsten film is formed on the doped amorphous silicon (DASI) film having a phosphorous impurity concentration of $1 \times 10^{20}$ atoms/cm$^3$, then annealing the tungsten film and the amorphous silicon film for thirty seconds by setting the substrate temperature to 400° C., 600° C. and 800° C. When the conditions under the tungsten film are measured by using the XRD spectrum measurement, as shown in FIG. 15, the exist no peak at an angle 2 θ indicating tungsten silicide (WSi) on the heating temperature 400° C. and 600° C. However, the peak indicating WSi on the heating temperature 800° C. has been confirmed.

Figure 16:
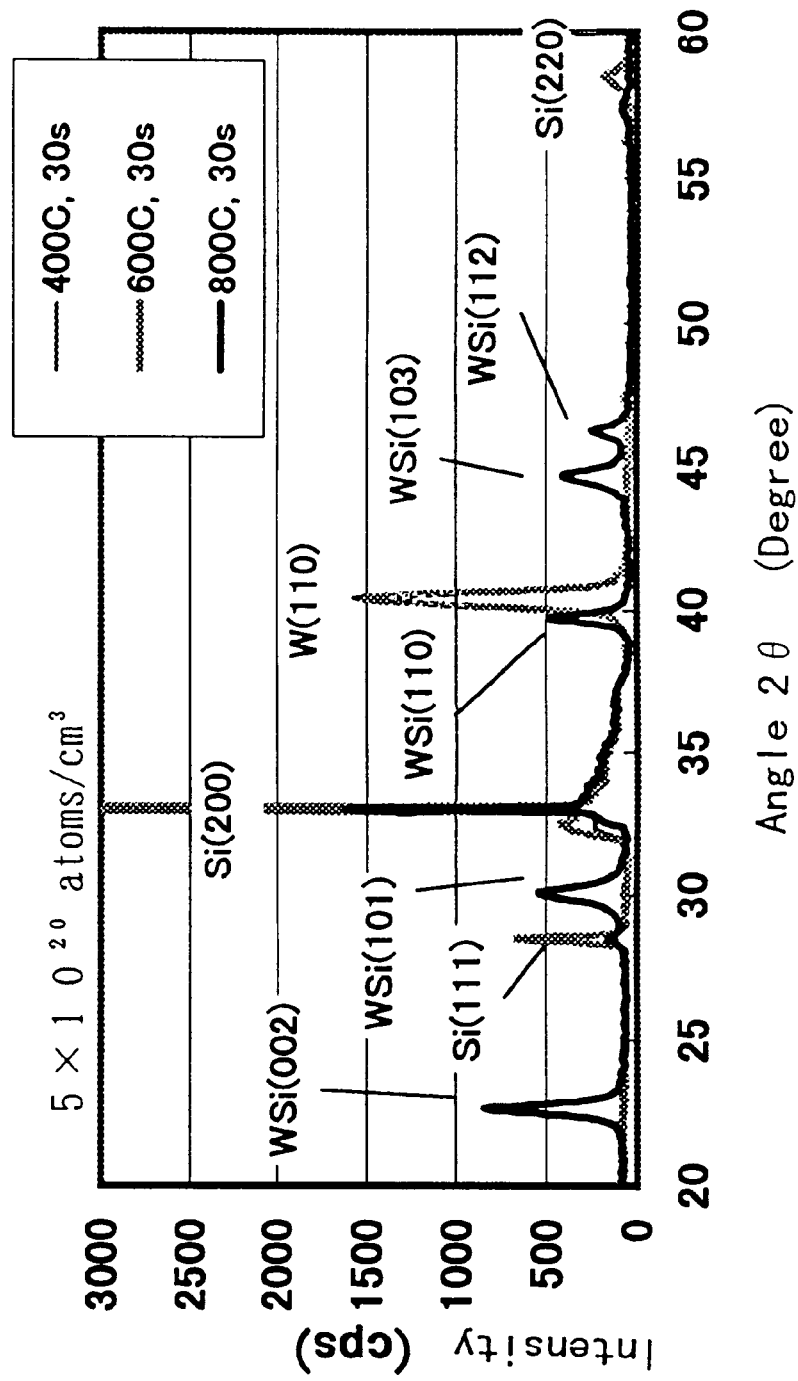
FIG. 16 is a view showing an XRD spectrum of a silicon film having a high impurity concentration $5 \times 10^{20}$ atoms/cm$^3$ and a tungsten film formed on the silicon film after annealing, in the steps of forming the capacitor according to the fourth embodiment of the present invention.

Next, the tungsten film is formed on the doped amorphous silicon (DASI) film having a phosphorous impurity concentration of $5 \times 10^{20}$ atoms/cm$^3$, then annealing the tungsten film and the amorphous silicon film for thirty seconds by setting the substrate temperature to 400° C., 600° C. and 800° C. When the conditions under the tungsten film are measured by using the XRD spectrum measurement, as shown in FIG. 16, the exist no peak at an angle 2 θ indicating tungsten silicide (WSi) on the heating temperature 400° C. and 600° C. However, the peak indicating WSi on the heating temperature 800° C. has been confirmed.

Further, the tungsten film is formed on the doped amorphous silicon (DASI) film having a phosphorous impurity concentration of $1 \times 10^{21}$ atoms/cm$^3$, then annealing the tungsten film and the amorphous silicon film for thirty seconds by setting the substrate temperature to 400° C., 600°

Figure 17:
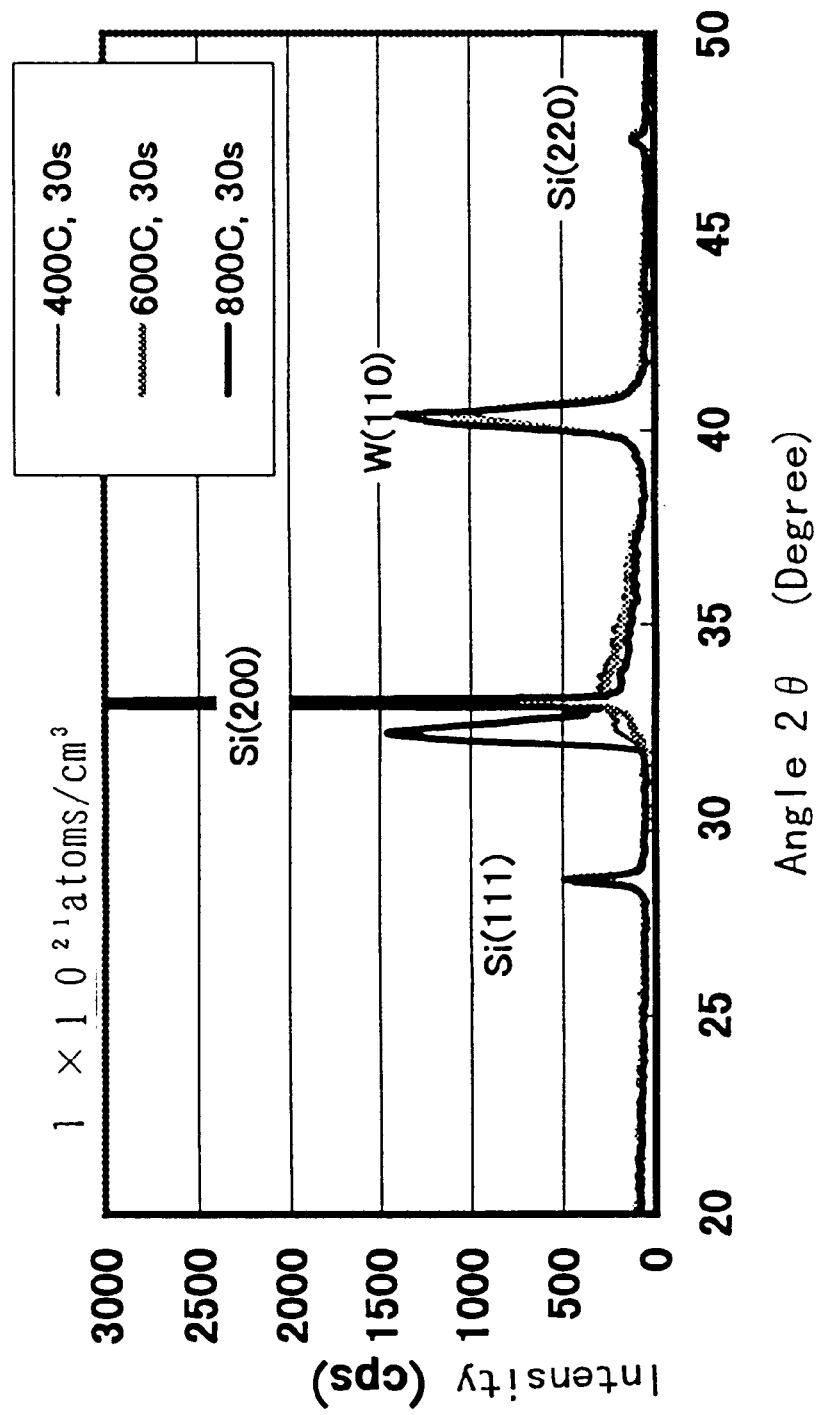
FIG. 17 is a view showing an XRD spectrum of a silicon film having a high impurity concentration $1 \times 10^{21}$ atoms/cm$^3$ and a tungsten film formed on the silicon film after annealing, in the steps of forming the capacitor according to the fourth embodiment of the present invention.

C. and 800° C. When the conditions under the tungsten film are measured by using the XRD spectrum measurement, as shown in FIG. 17, the exist no peak at an angle 2 θ indicating tungsten silicide (WSi) on the heating temperature 400° C., 600° C. and 800° C.

(Fifth Embodiment)

Figure 18:
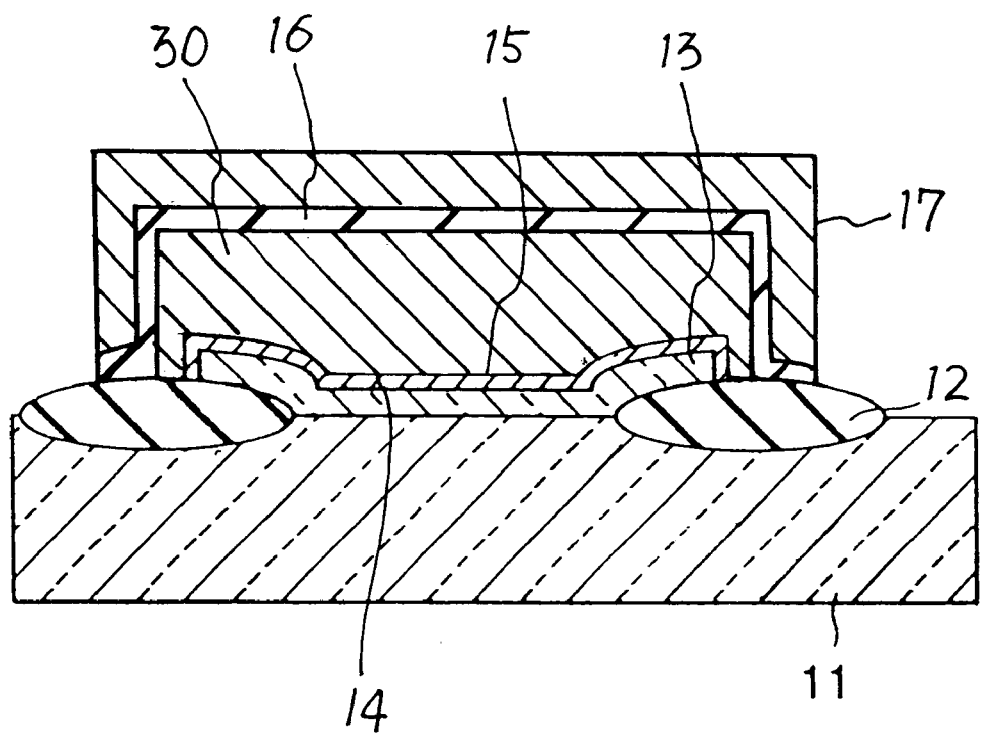
FIG. 18 is a sectional view showing a semiconductor device having a capacitor according to a fifth embodiment of the present invention.

FIG. 18 is sectional View showing a capacitor according to a fifth embodiment of the present invention.

As shown in FIG. 18, a ruthenium metal film 30 is formed between the $Ta_2O_5$ film 16 and the tungsten nitride film 15.

When the $Ta_2O_5$ film 16 is formed on the ruthenium metal film 30, an oxygen is applied to the tungsten nitride film 15 through the ruthenium metal film 30. If there is no the tungsten nitride film 15, the oxygen reacts on a silicon applied through the tungsten film 14. As the result, the silicon oxidation is formed on the tungsten film 14.

In the present embodiment, as the tungsten nitride film (refractory metal nitride film) 15 and tungsten film (refractory metal film) 14 are formed between the silicon film 13 and the ruthenium metal film 30, the tungsten nitride film 15 prevents the oxygen from applying to a surface of the tungsten film 14.

The tungsten nitride film 14 which is formed on the silicon film 13 having the impurity concentration to $1.5\times 10^{17}$ atoms/cm$^3$ or more in an atmosphere not-introducing a reduction gas is using as a barrier metal. And, the tungsten nitride film 15 is using as a barrier metal.

In the above embodiments, the tungsten nitride film may be formed on the tungsten film by CVD method.

As described above, according to the present invention, since the tungsten nitride film is formed as the barrier conductive film of the lower electrode which is contact with the capacitor dielectric film containing the oxygen, diffusion of the oxygen from the capacitor dielectric film to the peripheral portion can be suppressed, so that the film quality can be maintained.

Since the semiconductor film is employed as the base portion of the lower electrode of the capacitor, a complicated structure like the cylinder type can be formed as the capacitor.

Accordingly, the capacitor having the complicated structure can be formed and also the leakage current of the overall capacitor can be suppressed.

According to another aspect of the present invention, in case the refractory metal film is formed on the semiconductor film made of the silicon of the impurity concentration of $1.5\times 10^{17}$ atoms/cm$^3$, the refractory metal halogenated gas is employed in the atmosphere in which the reduction gas like the silicon compound gas is not contained. Therefore, in succeeding annealing steps of more than 500° C., reaction between the constituent element in the semiconductor film and the refractory metal film can be prevented and thus formation of the semiconductor oxide on the surface of the refractory metal film can be prevented. As a result, reduction in the dielectric constant between the upper electrode and the lower electrode can be prevented and also reduction in the capacitance of the capacitor can be prevented.

Also, if the refractory metal film is formed between the silicon film and the metal film formed thereon, such refractory metal film can be utilized as the barrier metal.

What is claimed is:

1. A method of manufacturing a semiconductor device comprising the steps of:

forming a semiconductor film electrically connected to a semiconductor substrate, the semiconductor film including a conductivity type impurity whose concentration is greater than $5\times 10^{20}$ atoms/cm$^3$ and less than $1\times 10^{22}$ atoms/cm$^3$;

forming the tungsten film as a capacitor lower electrode selectively on the semiconductor film in an atmosphere where a tungsten compound gas is introduced but a reduction gas is not introduced;

forming a tungsten nitride film by nitriding a surface of the tungsten film by using a nitrogen gas or a nitrogen containing gas;

forming a capacitor dielectric film made of oxygen compound on the tungsten nitride film;

annealing the capacitor dielectric film in an oxygen containing gas; and forming a capacitor upper electrode made of a conductive film on the capacitor dielectric film.

2. A method of manufacturing a semiconductor device according to claim 1, wherein the nitrogen containing gas is formed of monomethylhydrazine, dimethylhydrazine, or ammonia.

3. A method of manufacturing a semiconductor device according to claim 1, wherein the tungsten compound gas is a tungsten hexaflouride gas.

4. A method of manufacturing a semiconductor device according to claim 1, wherein the capacitor dielectric film is a tantalum oxide film.

5. A method of manufacturing a semiconductor device according to claim 1, wherein the capacitor dielectric film is formed of a film containing tantalum oxide.

6. A method of manufacturing a semiconductor device according to claim 1, wherein the conductive film is made of a single layer which is a tungsten nitride containing film, a titanium nitride containing film or a platinum containing film formed on the capacitor dielectric film, or multiple layers including the tungsten nitride containing film, the titanium nitride containing film or the platinum containing film.

7. A method of manufacturing a semiconductor device according to claim 2, wherein the nitrogen containing gas is plasmanized.

8. A method of manufacturing a semiconductor device comprising the steps of:

forming a semiconductor film made of silicon or silicon compound, the semiconductor film including a conductivity type impurity whose concentration is greater than $5\times 10^{20}$ atoms/cm$^3$ and less than $1\times 10^{22}$ atoms/cm$^3$, the semiconductor film being electrically connected to a semiconductor substrate;

forming the refractory metal film selectively on a surface of the semiconductor film in an atmosphere which is not introducing a reduction gas and introducing a refractory metal halogenated gas into the atmosphere;

forming a refractory metal nitride film on the refractory metal film;

forming a dielectric oxide film of group 4A elements or group 5A elements on the refractory metal nitride film; and crystallizing the dielectric oxide film by virtue of heat treatment at 500° C. or more.

9. A method of manufacturing a semiconductor device according to claim 8, further comprising the step of:

compensating oxygen into the dielectric oxide film before or after the step of crystallizing the dielectric oxide film.

10. A method of manufacturing a semiconductor device according to claim 9, wherein compensation of the oxygen into the dielectric oxide film is carried out in an atmosphere of oxygen plasma or ultraviolet ozone.

11. A method of manufacturing a semiconductor device according to claim 8, wherein the semiconductor film is formed of an amorphous film or a polysilicon film.

12. A method of manufacturing a semiconductor device according to claim 8, wherein the refractory metal halogenated gas is formed of a tungsten hexafluoride gas.

13. A method of manufacturing a semiconductor device according to claim 8, wherein the refractory metal halogenated gas is introduced into the atmosphere by using an inert gas as a carrier gas.

14. A method of manufacturing a semiconductor device according to claim 13, wherein the inert gas is a helium or argon.

15. A method of manufacturing a semiconductor device according to claim 8, wherein the refractory metal halogenated gas is introduced into the atmosphere by using a nitrogen gas as a carrier gas.

16. A method of manufacturing a semiconductor device according to claim 8, wherein the reduction gas is formed of a silicon compound gas.

17. A method of manufacturing a semiconductor device according to claim 16, wherein the silicon compound gas is a silane gas.

18. A method manufacturing a semiconductor device comprising the steps of:

forming a semiconductor film on or above a semiconductor substrate, said semiconductor film including a conductivity type impurity whose concentration is greater than $5 \times 10^{20}$ atoms/cm$^3$ and less than $1 \times 10^{22}$ atoms/cm$^3$;

forming the refractory metal film on the semiconductor film in an atmosphere which is not introducing a reduction gas and introducing a refractory metal halogenated gas into the atmosphere;

forming a refractory metal nitride film on the refractory metal film;

forming a ruthenium metal film on the refractory metal nitride film;

forming an oxygen compound film on the ruthenium metal film; and annealing the oxygen compound film in an oxygen containing gas.

19. A method of manufacturing a semiconductor device according to claim 18, wherein the refractory metal film is made of a tungsten film, the refractory metal nitride film is made of a tungsten nitride film.

* * * * *